US011961557B2

(12) United States Patent
Kobayashi

(10) Patent No.: US 11,961,557 B2
(45) Date of Patent: Apr. 16, 2024

(54) MEMORY DEVICE

(71) Applicant: Kioxia Corporation, Tokyo (JP)

(72) Inventor: Yosuke Kobayashi, Seoul (KR)

(73) Assignee: Kioxia Corporation, Tokyo (JP)

( * ) Notice: Subject to any disclaimer, the term of this patent is extended or adjusted under 35 U.S.C. 154(b) by 147 days.

(21) Appl. No.: 17/842,486

(22) Filed: Jun. 16, 2022

(65) Prior Publication Data

US 2023/0290408 A1 Sep. 14, 2023

(30) Foreign Application Priority Data

Mar. 11, 2022 (JP) ................. 2022-038284

(51) Int. Cl.
G11C 11/22 (2006.01)
G11C 7/08 (2006.01)
G11C 13/00 (2006.01)

(52) U.S. Cl.
CPC ............. *G11C 13/004* (2013.01); *G11C 7/08* (2013.01); *G11C 13/0038* (2013.01); *G11C 13/0069* (2013.01)

(58) Field of Classification Search
CPC ..... G11C 13/004; G11C 7/08; G11C 13/0038; G11C 13/0069

USPC ........................................................ 365/145
See application file for complete search history.

(56) References Cited

U.S. PATENT DOCUMENTS

| 7,102,945 | B2 | 9/2006 | Tsuchida et al. | |
|---|---|---|---|---|
| 8,830,733 | B2 | 9/2014 | El Baraji et al. | |
| 2017/0084825 | A1* | 3/2017 | Tsunoda | ................ G11C 11/161 |
| 2022/0262436 | A1* | 8/2022 | Asao | .................. G11C 13/0064 |

FOREIGN PATENT DOCUMENTS

| JP | 3959417 B2 | 8/2007 |
|---|---|---|
| JP | 5502692 B2 | 3/2014 |
| JP | 2017059740 A | 3/2017 |

* cited by examiner

Primary Examiner — Vu A Le
(74) Attorney, Agent, or Firm — Holtz, Holtz & Volek PC

(57) ABSTRACT

A memory cell is coupled between first and interconnects and includes a variable resistance element and a switching element. The variable resistance element includes first and second ferromagnetic layers and an insulating layer between the first and second ferromagnetic layers. A first circuit is configured to apply a first voltage to the first interconnect. A second circuit is configured to apply a second voltage to the second interconnect. A third circuit is configured to apply a third voltage to the second interconnect. A fourth circuit is configured to apply a fourth voltage to the first interconnect. A sense amplifier circuit is coupled to the first and second interconnects.

18 Claims, 24 Drawing Sheets

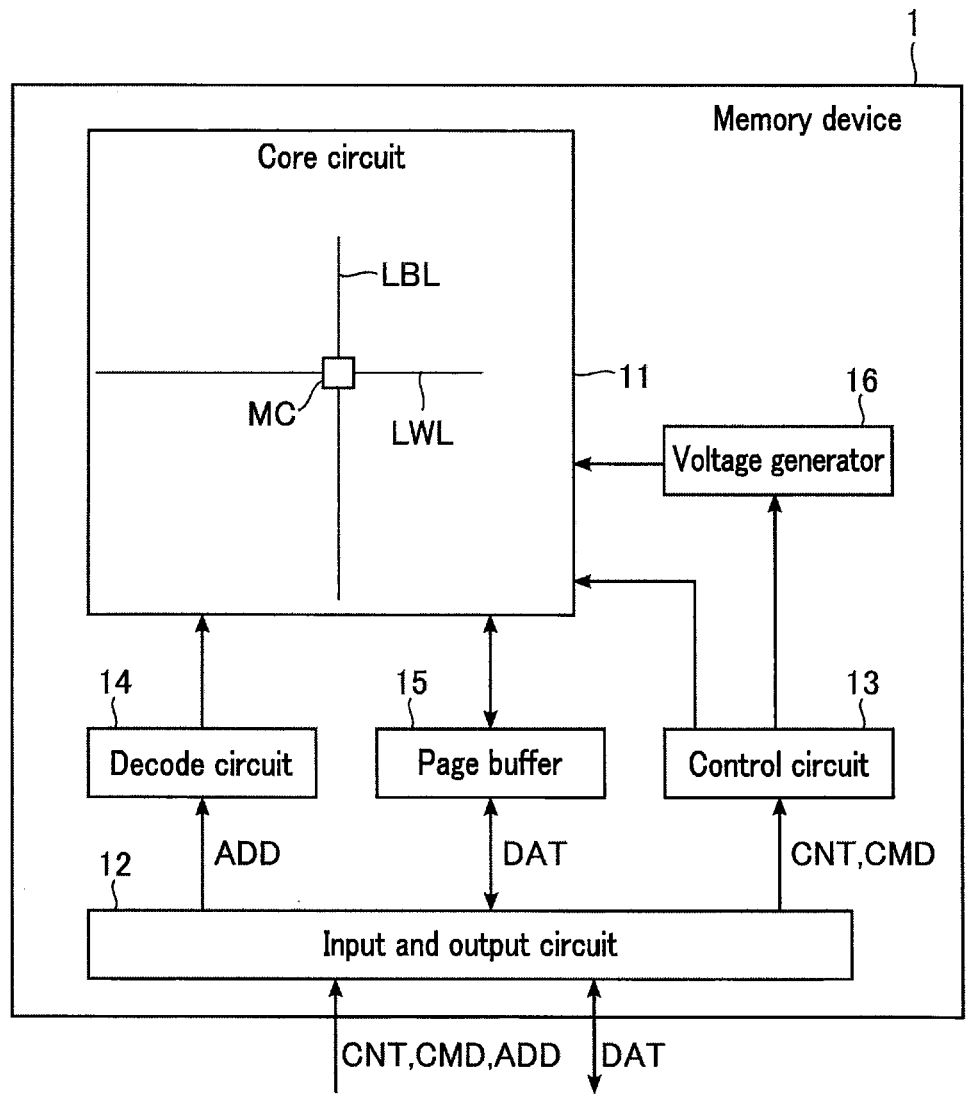
F I G. 1

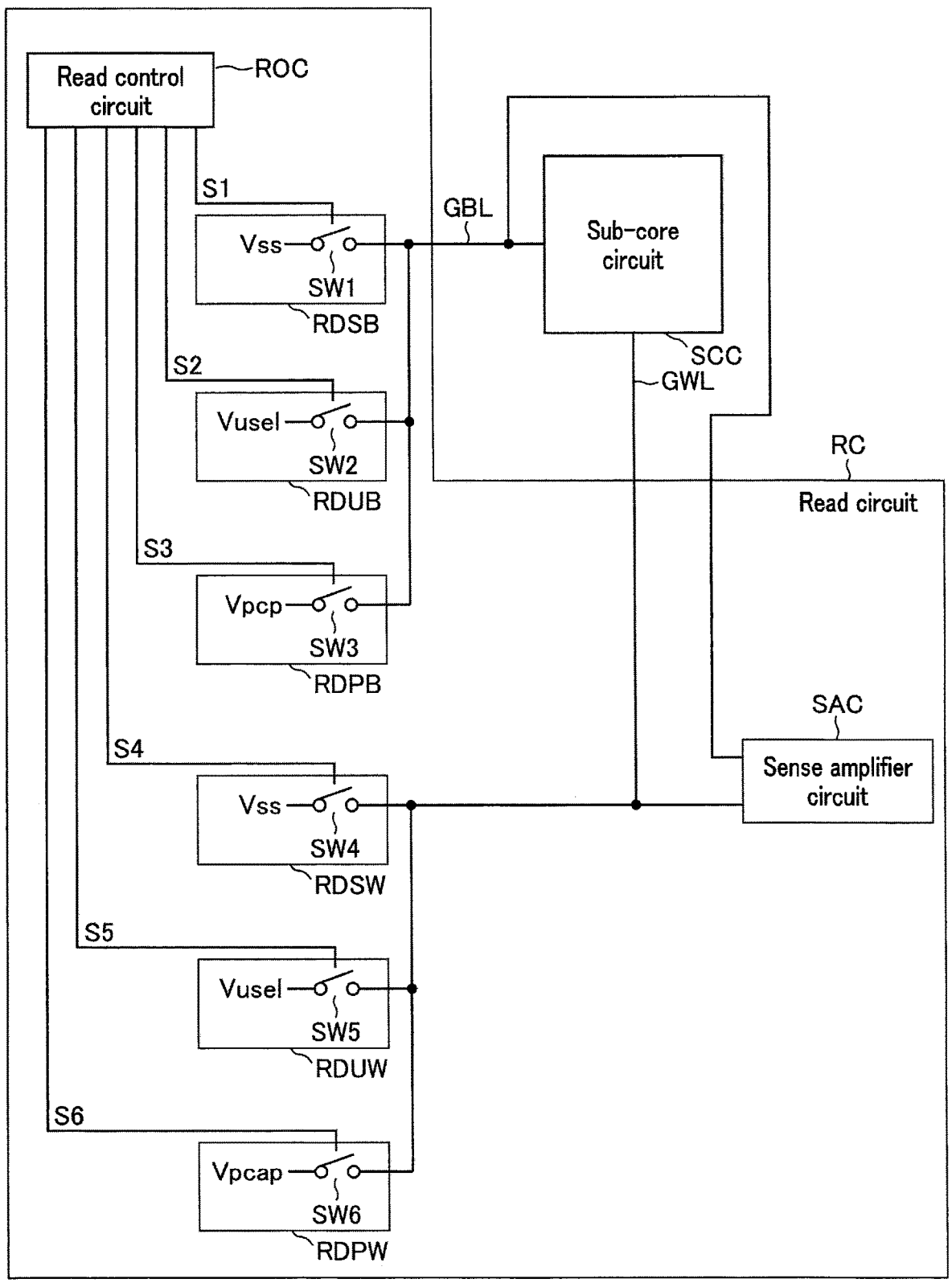
F I G. 7

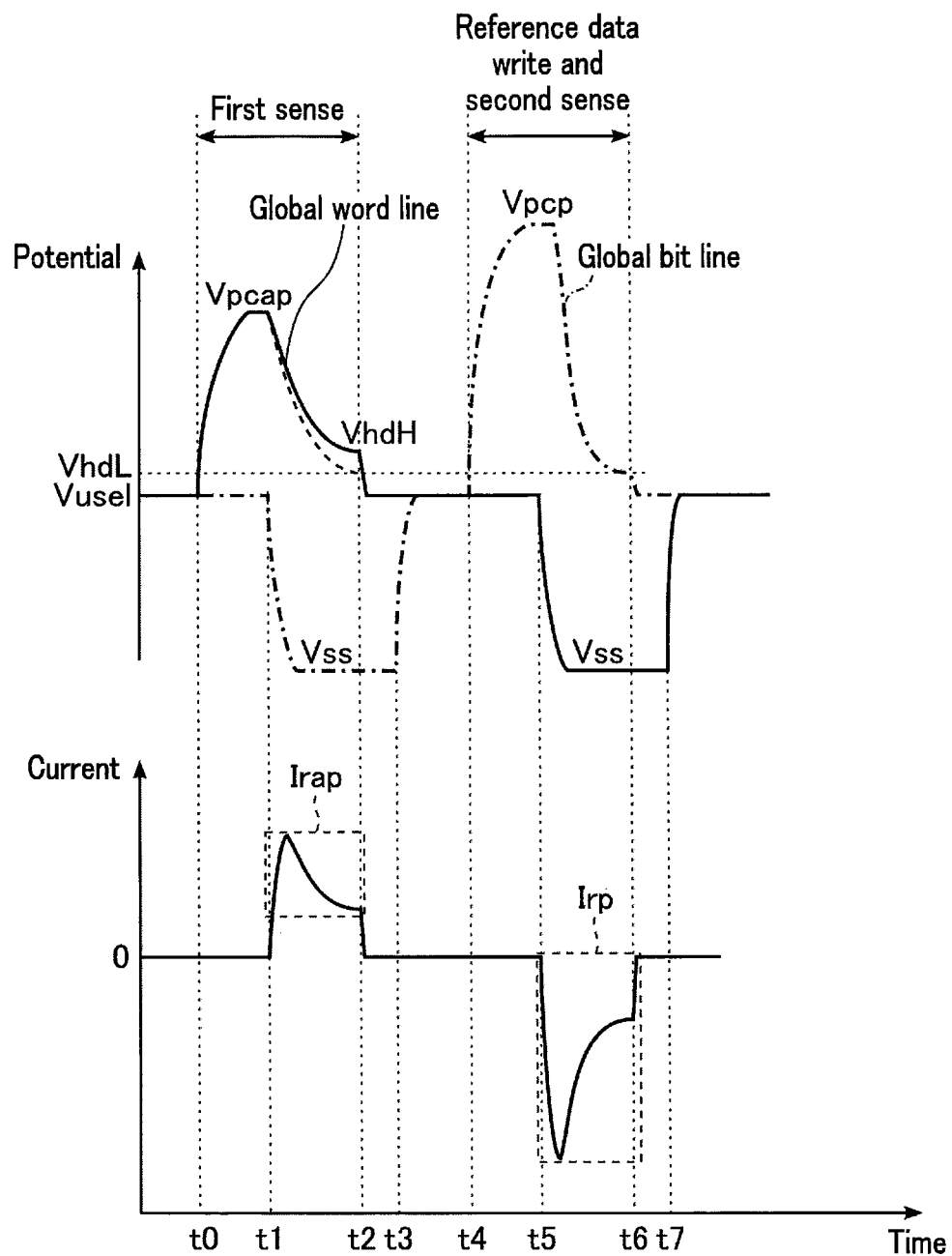
F I G. 9

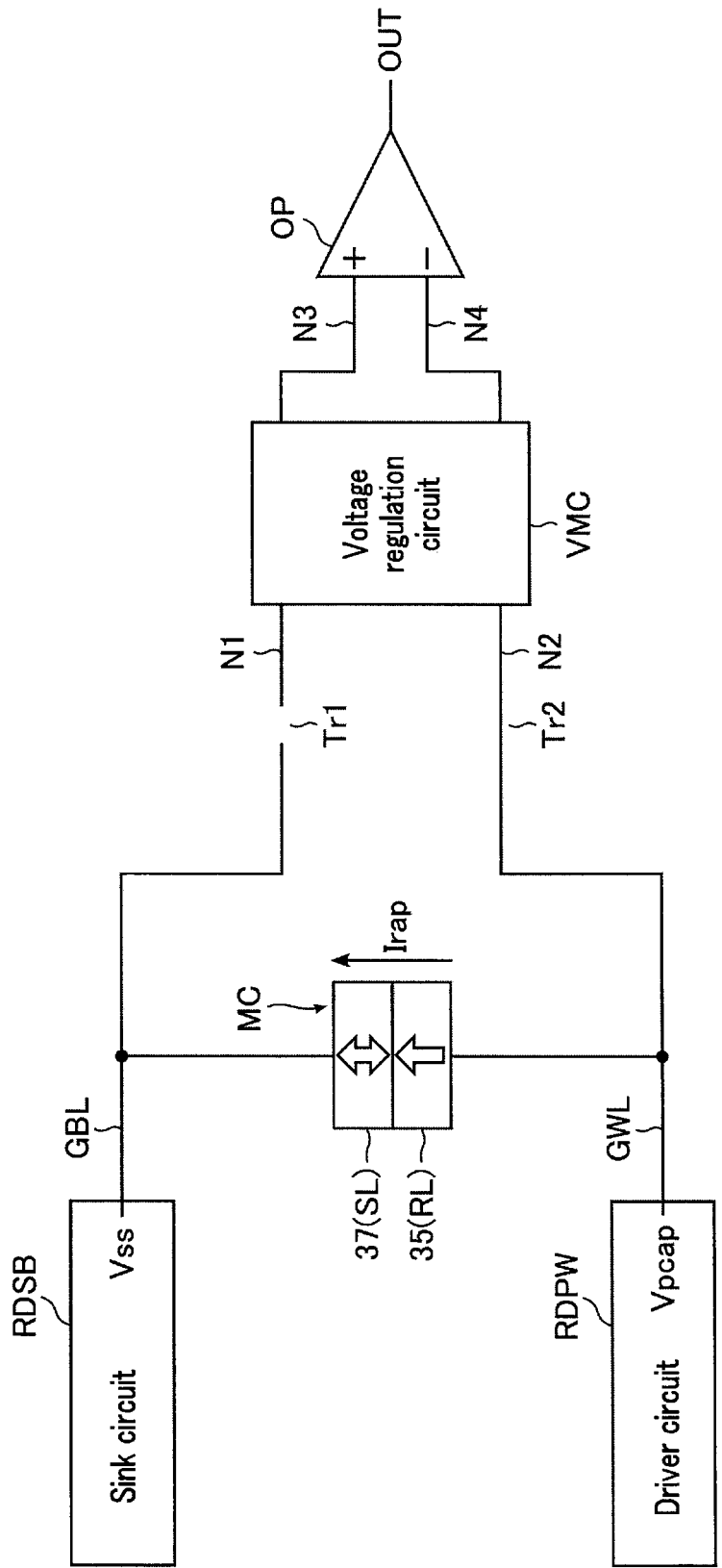
F I G. 10

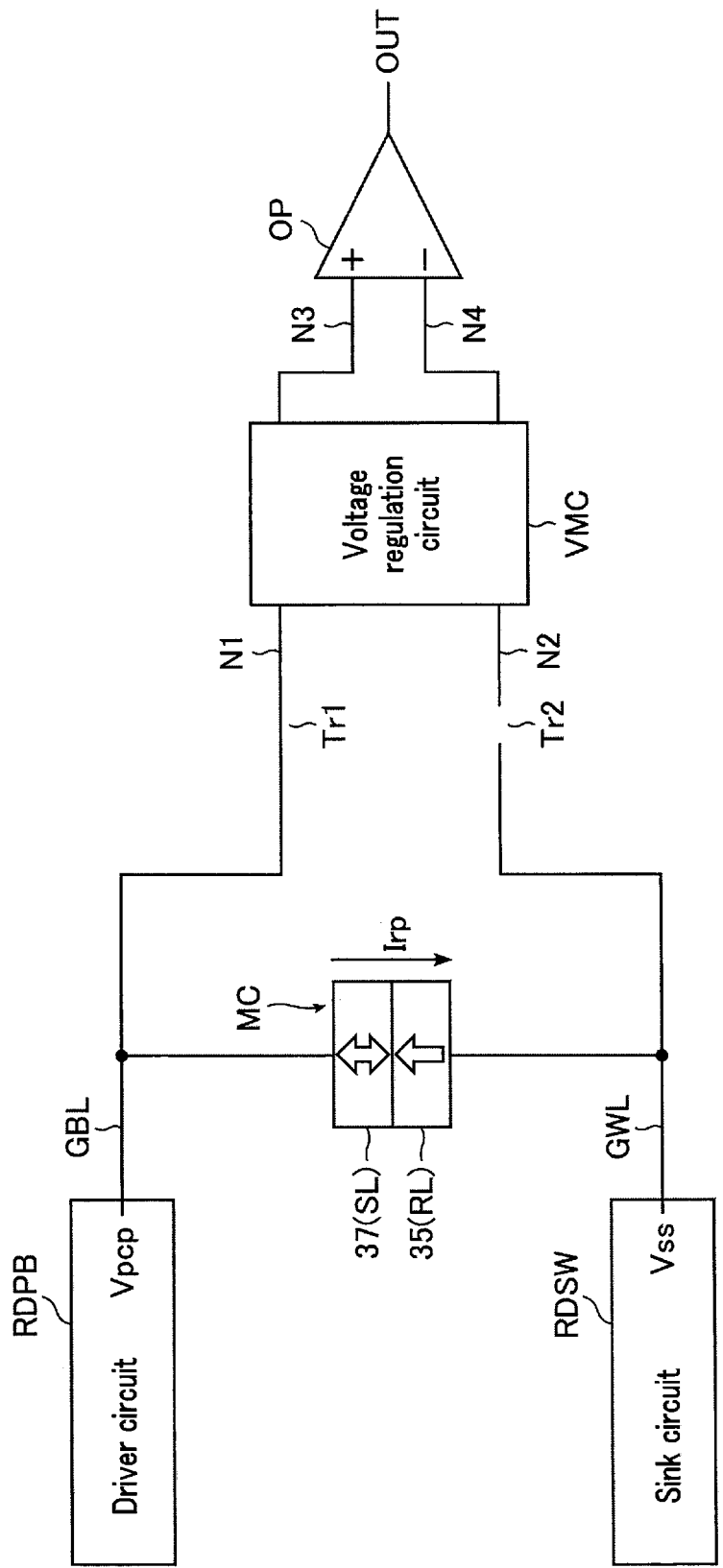
F I G. 11

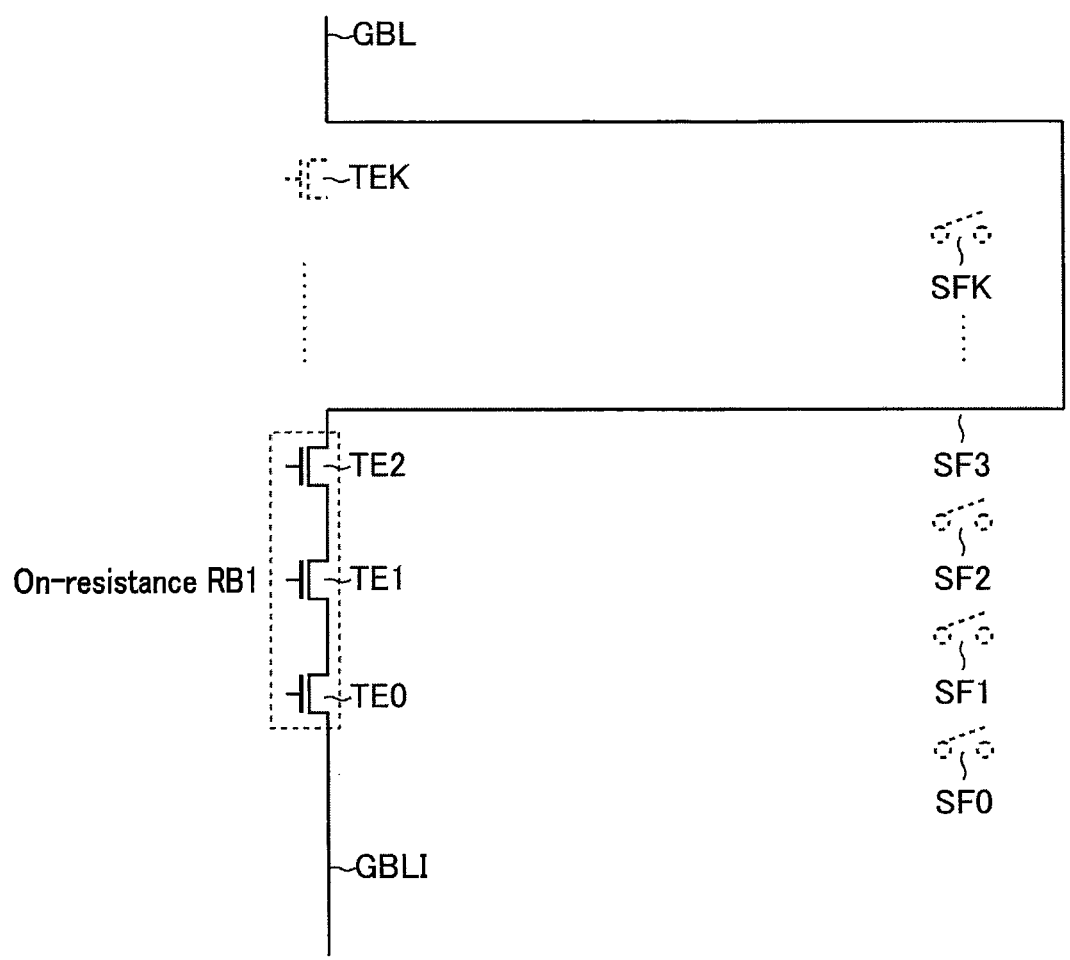
F I G. 20

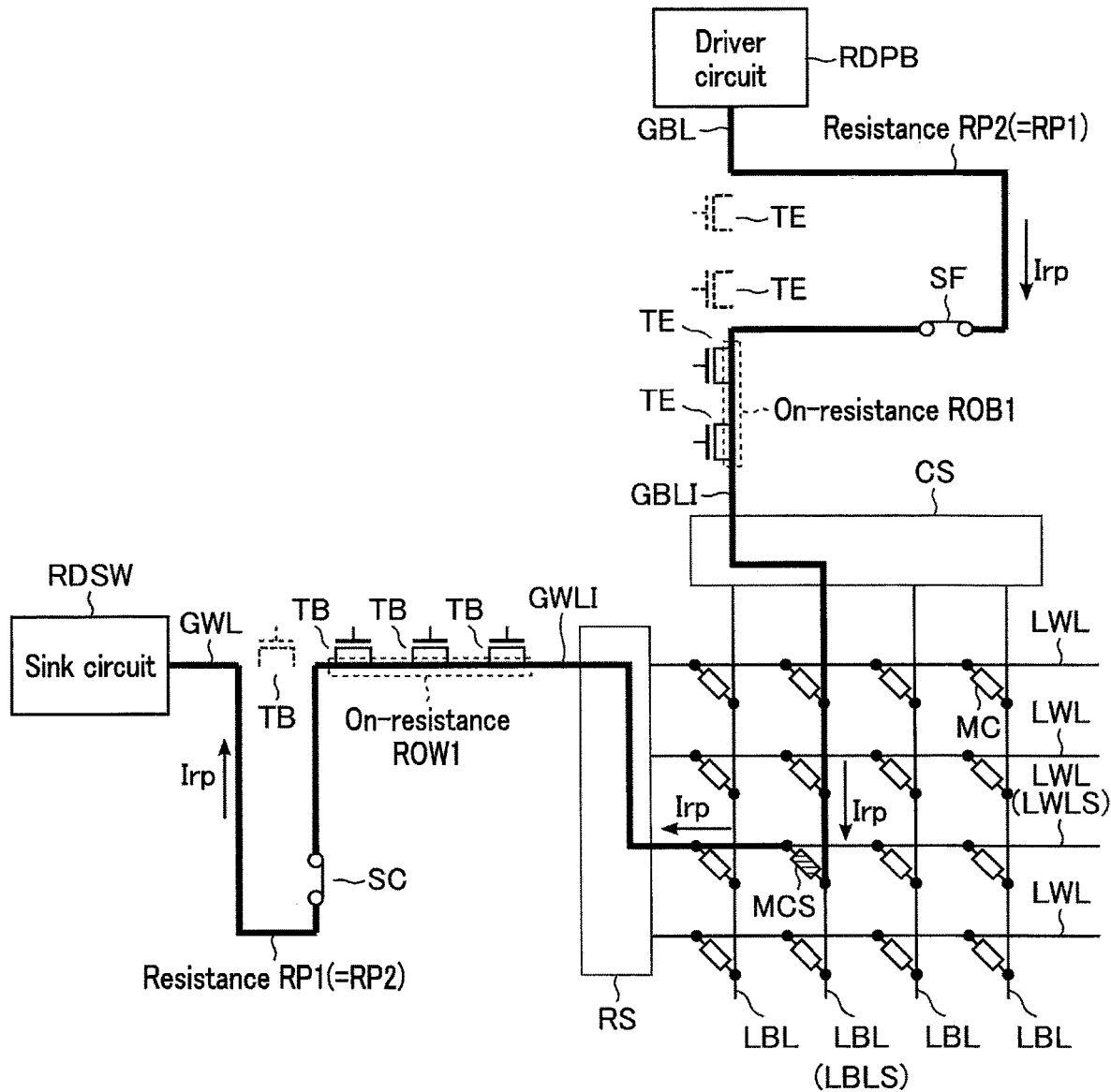
F I G. 22

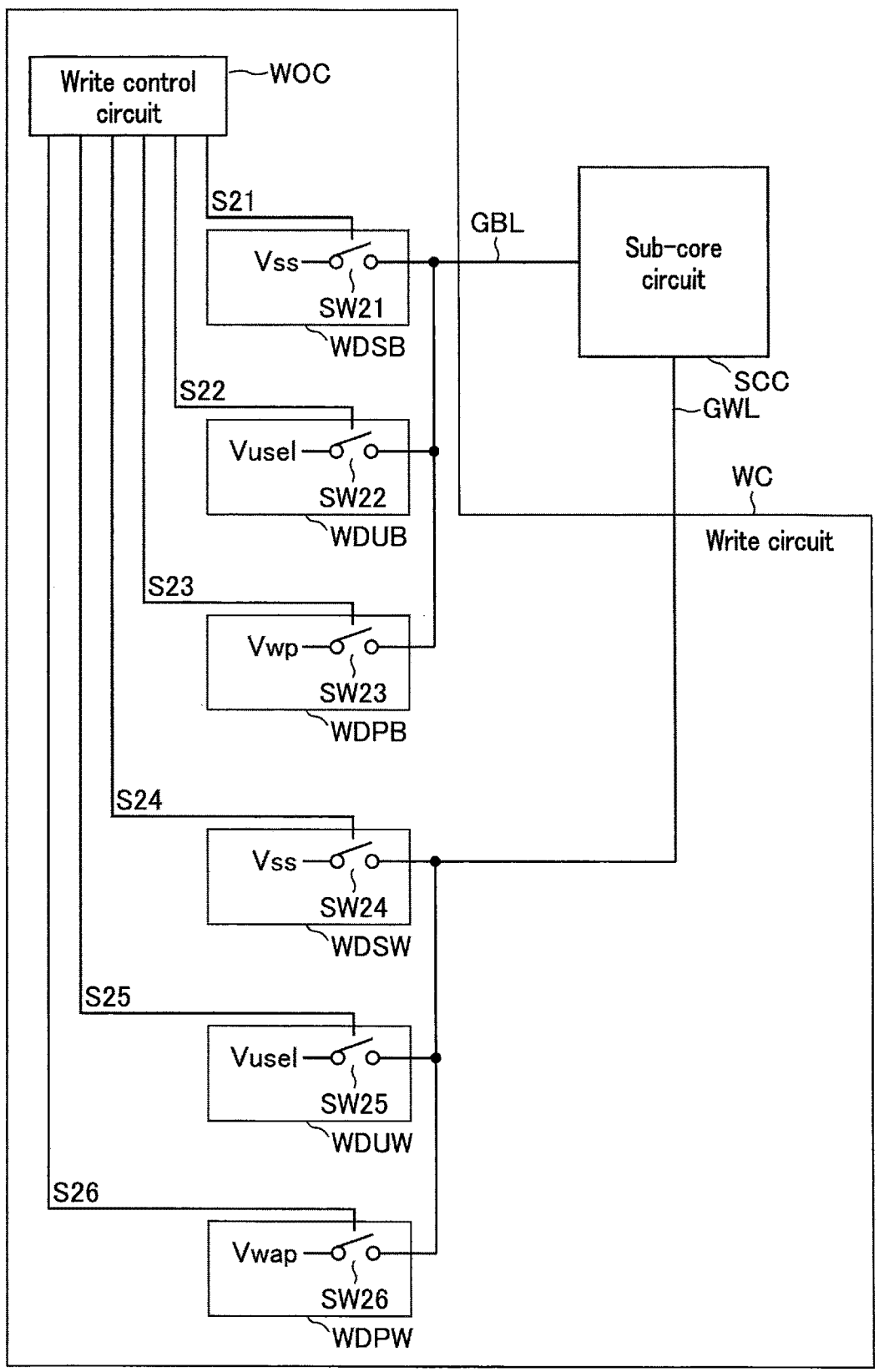
F I G. 23

US 11,961,557 B2

MEMORY DEVICE

CROSS-REFERENCE TO RELATED APPLICATION

This application is based upon and claims the benefit of priority from prior Japanese Patent Application No. 2022-38284, filed Mar. 11, 2022, the entire contents of which are incorporated herein by reference.

FIELD

Embodiments described herein relate generally to a memory device.

BACKGROUND

Memory devices that store data using an element having a dynamically variable resistance are known. The memory devices are required to read data in a short time.

BRIEF DESCRIPTION OF THE DRAWINGS

FIG. 1 shows functional blocks of a memory device of a first embodiment.

FIG. 7 shows components of a read circuit of the first embodiment and coupling of the components.

FIG. 9 shows the relationship between time and potentials of several interconnects during data reading from the memory device of the first embodiment.

FIG. 10 shows an example of a state in which some data are being read from the memory device of the first embodiment.

FIG. 11 shows an example of a state in which some data are being read from the memory device of the first embodiment.

FIG. 20 shows an example of a state in which the GBL resistance adjustment circuit of the second embodiment is operating.

FIG. 22 shows an example of a state in which data is reading from the memory device of the second embodiment.

FIG. 23 shows components of a write circuit of a third embodiment and connection of the components.

DETAILED DESCRIPTION

Figure 2:
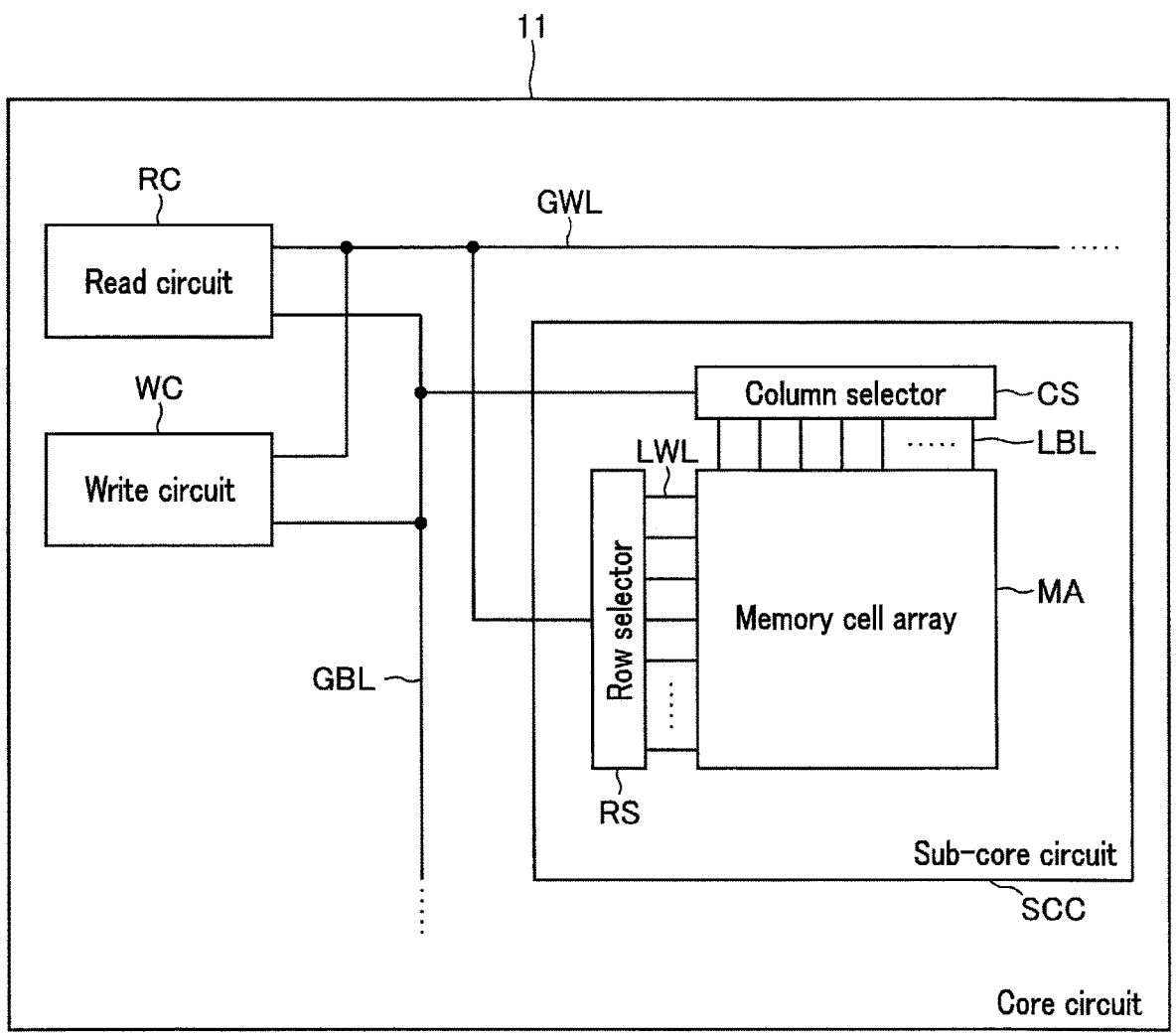
FIG. 2 shows functional blocks of a core circuit of the first embodiment.

In general according to one embodiment, a memory device includes a first interconnect, a second interconnect, a memory cell, a first circuit, a second circuit, a third circuit, a fourth circuit, and a sense amplifier circuit.

The memory cell is coupled between the first interconnect and the second interconnect and includes a variable resistance element and a switching element. The variable resistance element includes a first ferromagnetic layer, a second ferromagnetic layer, and an insulating layer between the first ferromagnetic layer and the second ferromagnetic layer. The first circuit is configured to apply a first voltage to the first interconnect. The second circuit is configured to apply a second voltage to the second interconnect. The third circuit is configured to apply a third voltage to the second interconnect. The fourth circuit is configured to apply a fourth voltage to the first interconnect. The sense amplifier circuit is coupled to the first interconnect and the second interconnect.

Embodiments will now be described with reference to the figures. In order to distinguish components having substantially the same function and configuration in an embodiment or over different embodiments from each other, an additional numeral or letter may be added to the end of each reference numeral or letter. In an embodiment subsequent to an embodiment that has already been described, matters that differ from the already described embodiment will mainly be discussed. The entire description of a particular embodiment also applies to another embodiment unless explicitly mentioned otherwise or obviously eliminated.

It is not necessary that functional blocks be distinguished as in the following examples. For example, some of the functions may be implemented by functional blocks different from those illustrated below. Furthermore, an illustrated functional block may be divided into functional sub-blocks.

In the specification and the claims, a phrase of a particular first component being "coupled" to another second component includes the first component being coupled to the second component either directly or via one or more components which are always or selectively conductive.

1. First Embodiment

1.1. Structure (Configuration)
1.1.1. Overall Configuration

FIG. 1 shows functional blocks of a memory device 1 of a first embodiment. The memory device 1 stores data. The memory device 1 stores data using a layer stack of magnets exhibiting variable resistance. The memory device 1 includes a core circuit 11, an input and output circuit 12, a control circuit 13, a decode circuit 14, a page buffer 15 and a voltage generator 16.

The core circuit 11 is a circuit including memory cells MC, interconnects for gaining access to the memory cells MC, and a peripheral circuit. The memory cells MC are elements that store data nonvolatilely. The interconnects include global word lines GWL (not shown), local word lines LWL, global bit lines GBL (not shown), and local bit lines LBL. Each of the memory cells MC is coupled to one local word line LWL and one local bit line LBL. The local word line LWL is assigned one row address. The local bit line LBL is assigned one column address.

The input and output circuit 12 inputs and outputs data and signals. The input and output circuit 12 receives a control signal CNT, a command CMD, an address signal ADD, and data DAT to be written to the memory cells MC, from an external device of the memory device 1, such as a memory controller.

The control circuit 13 controls the operation of the memory device 1. The control circuit 13 receives the command CMD and control signal CNT from the input and output circuit 12. The control circuit 13 controls the core circuit 11 based on the control indicated by the command CMD and the control signal CNT, and controls reading of data from the memory cells MC and writing of data to the memory cells MC. The control circuit 13 controls the voltage generator 16 based on the control indicated by the command CMD and the control signal CNT.

The decode circuit 14 decodes the address signal ADD. The decode circuit 14 receives the address signal ADD from the input and output circuit 12. The decode circuit 14 decodes the address signal ADD and generates signals for selecting a memory cell MC from which data is to be read or to which data is to be written, based on the result of the decoding. The generated signal is transmitted to the core circuit 11.

The page buffer 15 temporarily stores data of a certain size. Upon receipt of data DAT to be written to a memory cell MC from the input and output circuit 12, the page buffer 15 temporarily stores the data and transfers the data to the core circuit 11. The page buffer 15 receives the data from the memory cell MC, temporarily stores the read data, and transfers the data DAT to the input and output circuit 12.

The voltage generator 16 generates various voltages for use in the memory device 1. The voltage generator 16 generates voltages based on the control of the control circuit 13. The voltage generator 16 supplies the core circuit 11 with voltages for use in writing data to a memory cell MC during the data write. The voltage generator 16 supplies the core circuit 11 with voltages for use in reading data from a memory cell MC during the data read.

1.1.2. Configuration of Core Circuit

FIG. 2 shows functional blocks of the core circuit 11 of the first embodiment. As shown in FIG. 2, the core circuit 11 includes one or more sub-core circuits SCC, one or more global word lines GWL, one or more global bit lines GBL, one or more read circuits RC, and one or more write circuits WC. FIG. 2 simply shows one sub-core circuit SCC, one global word line GWL, one global bit line GBL, one read circuit RC, and one write circuit WC.

The sub-core circuit SCC includes a memory cell array MA, a row selector RS, and a column selector CS.

The memory cell array MA is a set of memory cells MC that are arrayed. A plurality of local word lines LWL and a plurality of local bit lines LBL are located in the memory cell array MA.

The row selector RS selects one row from the memory cell array MA in the sub-core circuit SCC including the row selector RS. The row selector RS receives a row address and, based on the received row address, couples one of the local word lines LWL of a memory cell array MA to be selected by the row selector RS (or a memory cell array MA corresponding to the row selector RS) to one global word line GWL. The row selector RS includes a plurality of switches. Each of the switches is coupled to one global word line GWL at one end and coupled to one local word line LWL at the other end. The switches are each a metal oxide semiconductor field effect transistor (MOSFET), such as an n-type MOSFET.

The column selector CS selects one column of the memory cell array MA in the sub-core circuit SCC including the column selector CS. The column selector CS receives a column address and, based on the received column address, couples one of the local bit lines LBL of a memory cell array MA to be selected by the column selector CS (or a memory cell array MA corresponding to the column selector RS) to one global bit line GBL. The column selector CS includes a plurality of switches. Each of the switch is coupled to one global bit line GBL at one end and coupled to one local bit line LBL at the other end. The switches are each a MOSFET, such as an n-type MOSFET.

The global word line GWL is coupled to the row selector RS of each of the sub-core circuits SCC. The global word line GWL is also coupled to one read circuit RC and one write circuit WC.

The global bit line GBL is coupled to the column selector CS of each of the sub-core circuits SCC. The global bit line GBL is also coupled to one read circuit RC and one write circuit WC.

The read circuit RC controls reading of data from the memory cells MC. The read circuit RC uses a voltage based on data stored in a memory cell MC from which data is to be read, to determine the data stored in the memory cell MC. The read circuit RC includes a plurality of sense amplifier circuits SAC (not shown). The sense amplifier circuits SAC use a voltage based on data stored in a memory cell MC from which data is to be read, to output a signal indicating the data stored in the memory cell MC. The sense amplifier circuits SAC output the determined data stored in a memory cell MC from which data is to be read, based on the relationship in magnitude between two voltages.

The write circuit WC controls writing of data to the memory cells MC. The write circuits WC receive data to be written. The write circuits WC write data to a memory cell MC to which data is to be written by causing a current to flow through the memory cell MC based on the data to be written.

1.1.3. Circuit Configuration of Memory Cell Array

Figure 3:
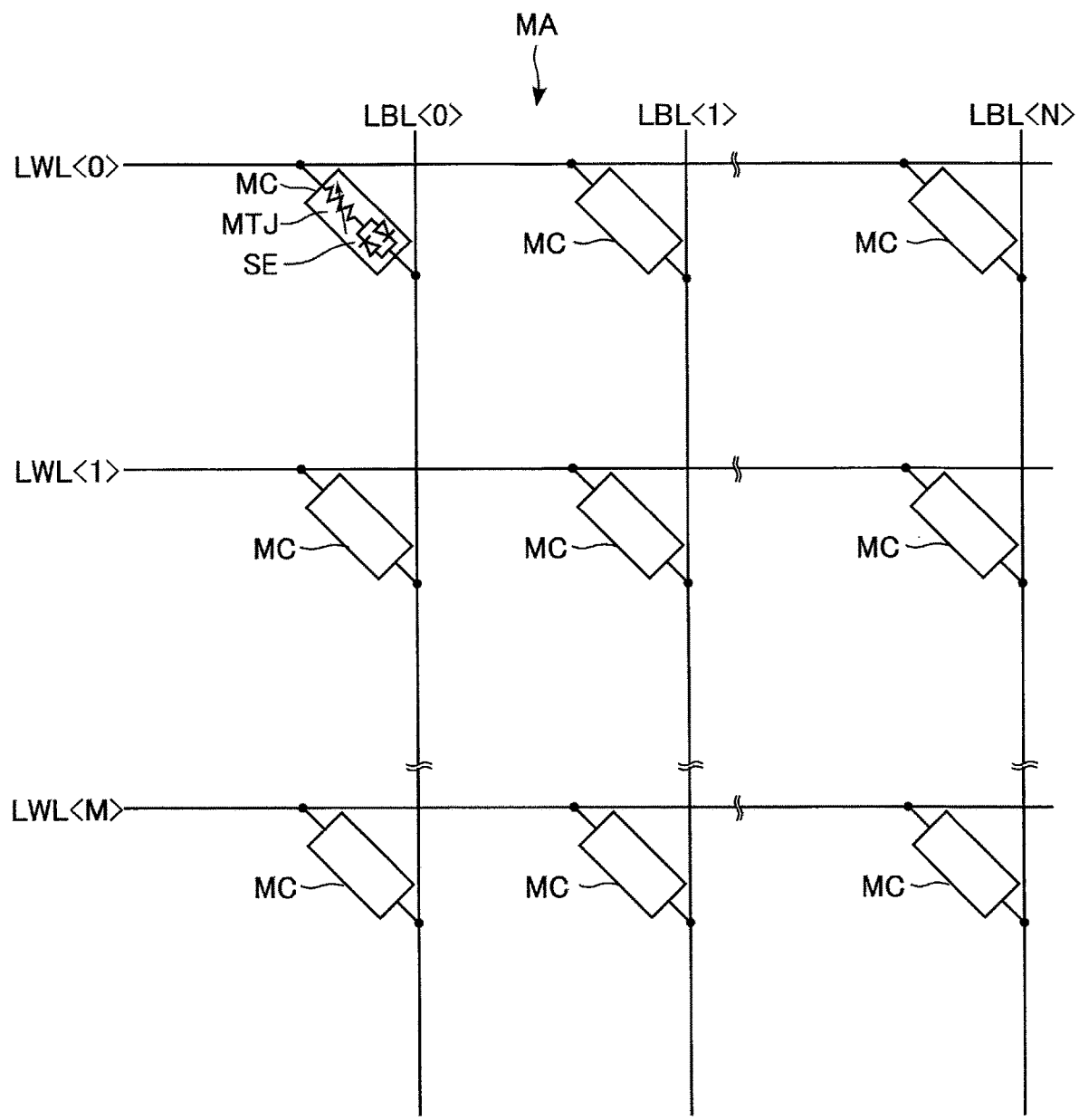
FIG. 3 is a circuit diagram of a memory cell array of the first embodiment.

FIG. 3 is a circuit diagram of the memory cell array MA of the first embodiment. As shown in FIG. 3, in the memory cell array MA, M+1 (M is a natural number) local word lines LWL (LWL<0>, LWL<1>, ..., LWL<M>) and N+1 (N is a natural number) local bit lines LBL (LBL<0>, LBL<1>, ..., LBL<N>) are located.

Each memory cell MC is coupled to one local word line LWL and one local bit line LBL. Each memory cell MC includes one MTJ element MTJ and one switching element SE. In each memory cell MC, the MTJ element MTJ and switching element SE are coupled in series. The switching element SE of each memory cell MC is coupled to one local bit line LBL. The MTJ element MTJ of each memory cell MC is coupled to one local word line LWL.

The MTJ element MTJ exhibits a tunnel magnetoresistance effect and includes, for example, a magnetic tunnel junction (MTJ). The MTJ element MTJ is a variable resistance element that can switch between a low-resistance state and a high-resistance state. The MTJ element MTJ can store one-bit data using a difference between the two resistance states. For example, the MTJ element MTJ stores "0" data in the low-resistance state and "1" data in the high-resistance state.

The switching element SE electrically couples or decouples its both ends to or from each other. The switching element SE has two terminals. When a voltage applied between the two terminals is lower than a first threshold value, the switching element SE is brought into a high-resistance state, such as an electrically non-conductive state (off state). When the voltage applied between the two terminals rises to the first threshold value or higher, the switching element SE is brought into a low-resistance state, such as an electrically conductive state (on state). When the voltage applied between the two terminals of the switching element SE in the low-resistance state drops to a second threshold value or lower, the switching element SE is brought into a high-resistance state. The switching element SE has a function of switching between the high-resistance and low-resistance states based on the magnitude of the voltage applied in such a first direction, and also has the same function in a second direction opposite to the first direction. That is, the switching element SE is a bidirectional switching element. Turning on or off the switching element SE makes it possible to control whether or not a current is supplied to the MTJ element MTJ coupled to the switching element SE, that is, whether or not the MTJ element MTJ is selected.

1.1.4. Structure of Memory Cell Array

Figure 4:
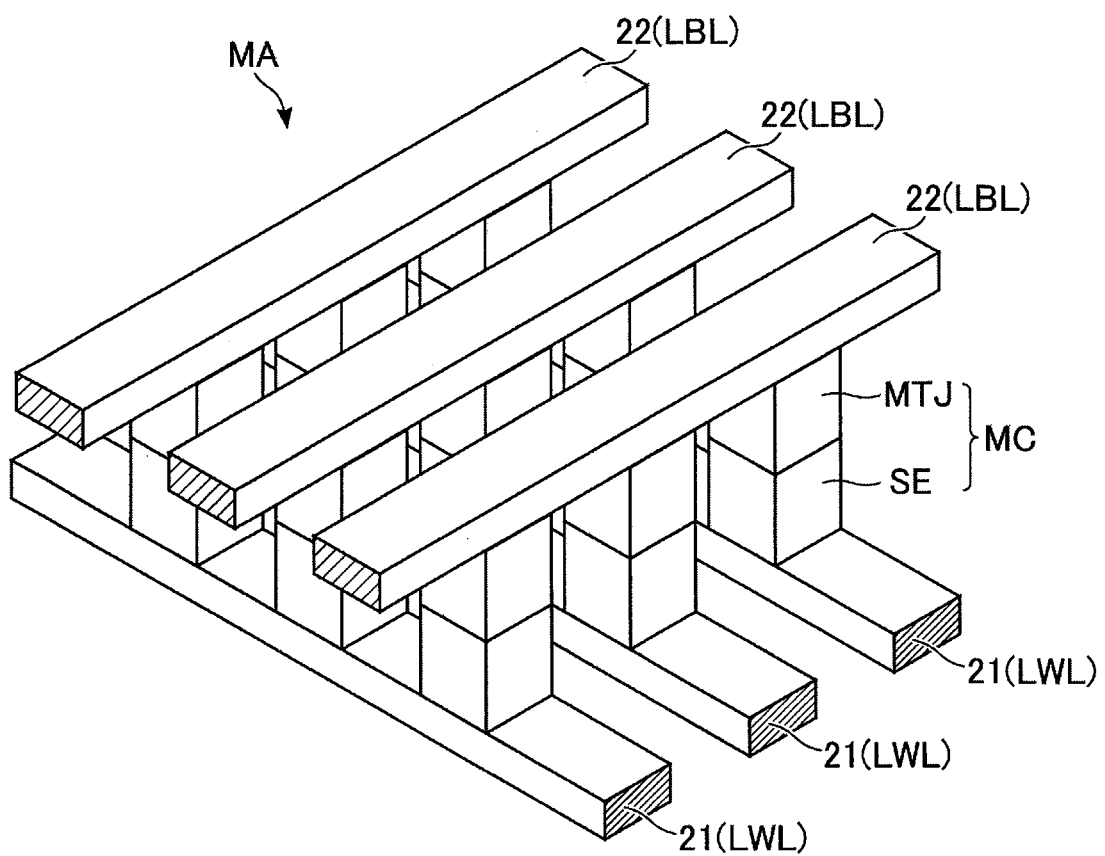
FIG. 4 is a perspective view of part of the memory cell array of the first embodiment.

FIG. 4 is a perspective view of part of the memory cell array MA of the first embodiment. As shown in FIG. 4, a plurality of conductors 21 and a plurality of conductors 22 are provided.

The conductors 21 extend along the x axis and are arranged along the y axis. Each of the conductors 21 functions as one local word line LWL.

The conductors 22 are located above the conductors 21. The conductors 22 extend along the y axis and are arranged along the x axis. Each of the conductors 22 functions as one local bit line LBL.

One memory cell MC is provided at each intersection of the conductors 21 and 22. The memory cells MC are arranged in a matrix along the xy plane. Each of the memory cells MC includes a structure functioning as a switching element SE and a structure functioning as an MTJ element MTJ. The structure functioning as a switching element SE and the structure functioning as an MTJ element MTJ each include one or more layers. For example, the structure functioning as an MTJ element MTJ is located on the upper surface of the structure functioning as a switching element SE. The lower surface of each memory cell MC is in contact with the upper surface of one conductor 21. The upper surface of the memory cell MC is in contact with the lower surface of one conductor 22. The structure functioning as a switching element SE may be located on the upper surface of the structure functioning as an MTJ element MTJ.

1.1.5. Memory Cell

Figure 5:
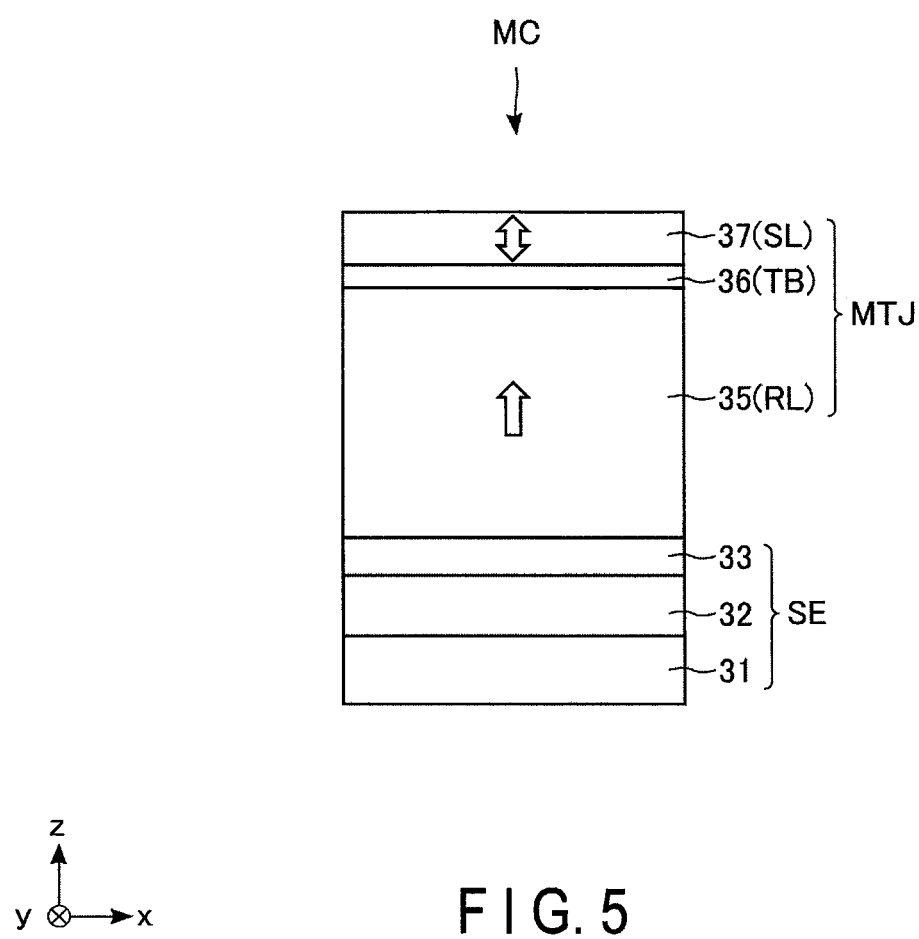
FIG. 5 shows a section of an example of a structure of a memory cell of the first embodiment.

FIG. 5 shows a section of an example of the structure of the memory cell MC of the first embodiment.

The switching element SE includes a variable resistance material 32. The variable resistance material 32 exhibits a dynamically variable resistance and has, for example, a layer shape. The variable resistance material 32 is a switching element between two terminals. Of the two terminals, a first terminal is one of the upper and lower surfaces of the variable resistance material 32, and a second terminal is the other of the upper and lower surfaces thereof. When the voltage applied between the two terminals is lower than a first threshold value, the variable resistance material is in a "high-resistance" state, such as an electrically non-conducting state. When the voltage applied between the two terminals rises to the first threshold value or higher, the variable resistance material is brought into a "low-resistance" state, such as an electrically conductive state. When the voltage applied between the two terminals of the variable resistance material 32 in the low-resistance state drops to a second threshold value or lower, the variable resistance material is brought into a high-resistance state. The variable resistance material 32 includes an insulator and dopant introduced into the insulator by ion implantation. The insulator includes, for example, an oxide and includes $SiO_2$ or a material substantially formed of $SiO_2$. The dopant includes, for example, arsenic (As) and germanium (Ge). In this specification and claims, the phrase "substantially formed of" and the like mean allowing an element "substantially formed of" to contain unintended impurities.

The switching element SE may further include a lower electrode 31 and an upper electrode 33. FIG. 5 shows an example of such a switching element. The variable resistance material 32 is located on the upper surface of the lower electrode 31, and the upper electrode 33 is located on the upper surface of the variable resistance material 32.

The MTJ element MTJ includes a ferromagnetic layer 35, an insulating layer 36 and a ferromagnetic layer 37. By way of example, as shown in FIG. 5, the insulating layer 36 is located on the upper surface of the ferromagnetic layer 35, and the ferromagnetic layer 37 is located on the upper surface of the insulating layer 36.

The ferromagnetic layer 35 is a layer of a material exhibiting ferromagnetism. The ferromagnetic layer 35 has an easy magnetization axis extending along a direction in which it penetrates the interface between the ferromagnetic layer 35 and the insulating layer 36 and the interface between the insulating layer 36 and the ferromagnetic layer 37. For example, the easy magnetization axis is at an angle of 45° through 90° to the interfaces and is along a direction orthogonal to the interfaces. It is intended that the direction of magnetization of the ferromagnetic layer 35 is not varied even by reading and writing data to and from the memory cell MC. The ferromagnetic layer 35 can function as what is called a reference layer. The ferromagnetic layer 35 may include a plurality of layers. Hereinafter, the ferromagnetic layer 35 may be referred to as a reference layer 35.

The insulating layer 36 is a layer of an insulator. The insulating layer 36 contains, for example, magnesium oxide (MgO) or is substantially formed of MgO to function as what is called a tunnel barrier.

The ferromagnetic layer 37 is a layer of a material exhibiting ferromagnetism. The ferromagnetic layer 37 contains, for example, cobalt iron boron (CoFeB) or iron boride (FeB) or is substantially composed of CoFeB or FeB. The ferromagnetic layer 37 has an easy magnetization axis along a direction in which it penetrates the interface between the ferromagnetic layer 35 and the insulating layer 36 and the interface between the insulating layer 36 and the ferromagnetic layer 37. For example, the easy magnetization axis is at an angle of 45° through 90° to the interfaces and is along a direction orthogonal to the interfaces. The direction of magnetization of the ferromagnetic layer 37 is varied by reading and writing data to and from the memory cell MC. The ferromagnetic layer 37 can function as what is called a recording layer. Hereinafter, the ferromagnetic layer 37 may be referred to as a storage layer 37.

When the magnetization direction of the storage layer 37 is parallel to that of the reference layer 35, the resistance of the MTJ element MTJ is low. When the magnetization direction of the storage layer 37 is antiparallel to that of the reference layer 35, the resistance of the MTJ element MTJ is higher than that in the case where the magnetization direction of the storage layer 37 is parallel to that of the reference layer 35. Hereinafter, the state in which the magnetization direction of the ferromagnetic layer 37 of an MTJ element MTJ is parallel to that of the reference layer 35 may be referred to as the MTJ element MTJ "in a parallel state" or "in a P state." The state in which the magnetization direction of the ferromagnetic layer 37 of an MTJ element MTJ is antiparallel to that of the reference layer 35 may be referred to as the MTJ element MTJ "in an antiparallel state" or "in an AP state."

When current Iwp that is larger than current Icp flows from the storage layer 37 toward the reference layer 35, the magnetization direction of the storage layer 37 becomes parallel to that of the reference layer 35. When current Iwap that is larger than current Icap flows from the ferromagnetic layer 35 toward the storage layer 37, the magnetization direction of the storage layer 37 becomes antiparallel to that of the reference layer 35. The current Icap is larger than the current Icp.

Hereinafter, the direction from the reference layer 35 toward the storage layer 37 may be referred to as an AP direction, and the direction from the storage layer 37 toward the reference layer 35 may be referred to as a P direction. The switching current Icp may be referred to as P-direction switching current Icp. The switching current Icap may be referred to as an AP-direction switching current Icap. The current Iwp may be referred to as a P write current Iwp. The current Iwap may be referred to as an AP write current Iwap.

The MTJ element MTJ may include one or more additional layers.

Figure 6:
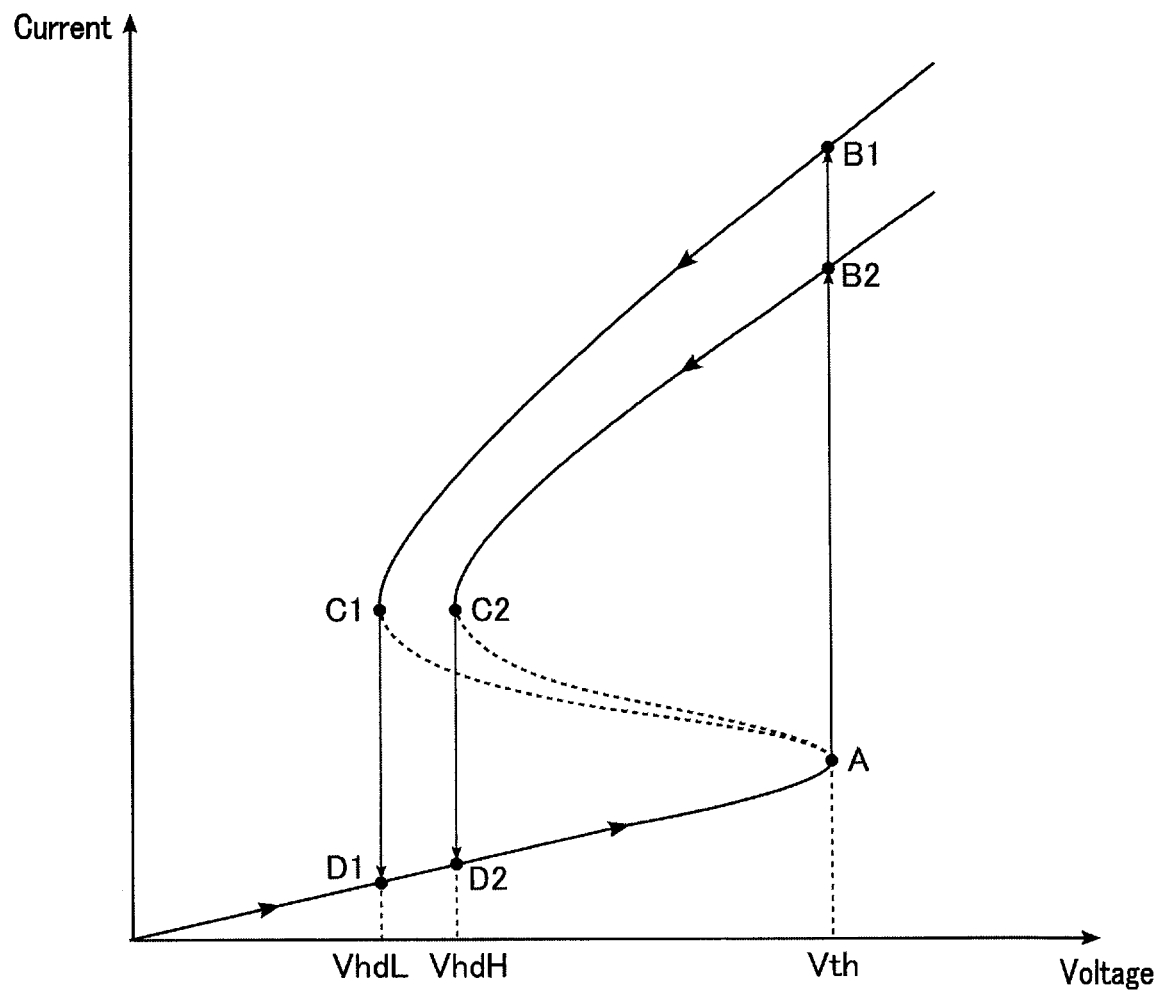
FIG. 6 is a graph showing an example of voltage and current characteristics of the memory cell of the first embodiment.

FIG. 6 is a graph showing an example of a curve of voltage and current characteristics of the memory cell MC of the first embodiment. The horizontal axis of the graph indicates the magnitude of a terminal voltage of the memory cell MC. The vertical axis thereof shows the magnitude of current flowing through the memory cell MC on a logarithmic scale. In FIG. 6, virtual characteristics that do not appear in practice are indicated by broken lines. FIG. 6 shows the memory cell MC in a low resistance state and in a high resistance state. The following descriptions apply to both the states.

As the voltage increases from 0, the current continues to increase until the voltage reaches a threshold voltage Vth. Until the voltage reaches the threshold voltage Vth, the switching element SE of the memory cell MC is in an off state, that is, a non-conductive state.

When the voltage further increases and reaches the threshold voltage Vth, i.e., point A, the voltage to current relationship shows a discontinuous change and also shows the characteristics indicated by points B1 and B2. The current at points B1 and B2 is much larger than that at point A. This sudden change in the current is due to the switching element SE of the memory cell MC being turned on. The current at points B1 and B2 depends on the resistance state of the MTJ element MTJ of the memory cell MC.

When the voltage decreases from the state in which the switching element SE is turned on, such as the state in which the voltage and current show the relationship indicated by point B1 or B2, the current continues to decrease.

When the voltage further decreases to a certain magnitude, the voltage to current relationship shows a discontinuous change. The voltage at which the voltage to current relationship starts to show discontinuity depends on the terminal voltage of the MTJ element MTJ of the memory cell MC, that is, on whether the MTJ element MTJ is in a high-resistance state or a low-resistance state. When the MTJ element MTJ is in a low-resistance state, the voltage to current relationship shows discontinuity from point C1. When the MTJ element MTJ is in a high-resistance state, the voltage to current relationship shows discontinuity from point C2. When the voltage to current relationship reaches points C1 and C2, the characteristics indicated by points D1 and D2 are shown. The currents at points D1 and D2 are much smaller than the currents at points C1 and C2, respectively. This sudden change in current is due to the switching element SE of the memory cell MC being turned off.

The terminal voltage at point D1 of a memory cell MC including an MTJ element MTJ in a low-resistance state will be referred to as a low hold voltage VhdL. The terminal voltage at point D2 of a memory cell MC including an MTJ element MTJ in a high-resistance state will be referred to as a high hold voltage VhdH. The high hold voltages VhdH of the memory cells MC may be varied by unintended variations in the characteristics of the memory cells MC. The low hold voltages VhdL of the memory cells MC may be varied by unintended variations in the characteristics of the memory cells MC.

1.1.7. Configuration of Read Circuit

FIG. 7 shows components of the read circuit of the first embodiment and coupling of the components. As shown in FIG. 7, the read circuit RC includes a read control circuit ROC, driver circuits RDUB, RDPB, RDUW and RDPW, sink circuits RDSB and RDSW, and a sense amplifier circuit SAC. FIG. 7 simply shows the components for one global bit line GBL and one global word line GWL. Driver circuits RDUB and RDPB and a sink circuit RDSB are provided for another global bit line GBL. In addition, driver circuits RDUW and RDPW, a sink circuit RDSW and a sense amplifier circuit SAC are also provided for another global word line GWL.

The sink circuit RDSB is configured to apply a ground voltage (or common voltage) Vss to the global bit line GBL. The ground voltage Vss is, for example, 0 V. The sink circuit RDSB may have any configuration as long as it can apply the ground voltage Vss to the global bit line GBL. For example, the sink circuit RDSB includes a switch SW1. The switch SW1 is coupled at one end to the global bit line GBL and at the other end to a node to which the ground voltage Vss in the memory device 1 (for example, the voltage generator 16) is applied. The switch SW1 is turned on or off in response to a control signal S1, and transfers the ground voltage Vss to the global bit line GBL while it is on. The switch SW1 receives the control signal S1 from the read control circuit ROC, for example. The switch SW1 is, for example, a MOSFET.

The sink circuit RDSW is configured to apply a ground voltage Vss to the global word line GWL. The sink circuit RDSW may have any configuration as long as it can apply the ground voltage Vss to the global word line GWL. For example, the sink circuit RDSW includes a switch SW4. The switch SW4 is coupled at one end to the global word line GWL and at the other end to a node to which the ground voltage Vss is applied. The switch SW4 is turned on or off in response to a control signal S4, and transfers the ground voltage Vss to the global word line GWL while it is on. The switch SW4 receives the control signal S4 from the read control circuit ROC, for example. The switch SW4 is, for example, a MOSFET.

The driver circuit RDPB is configured to apply a precharge voltage Vpcp to the global bit line GBL. The precharge voltage Vpcp has a magnitude to turn on the switching element SE of a memory cell MC by applying a voltage having a magnitude of the precharge voltage Vpcp to the memory cell MC. The precharge voltage Vpcp also has a magnitude to allow a current whose magnitude exceeds that of a P-direction switching current Icp to flow through the memory cell MC by applying the precharge voltage Vpcp to the memory cell MC. The driver circuit RDPB may have any configuration as long as it can apply the precharge voltage Vpcp to the global bit line GBL. For example, the driver circuit RDPB includes a switch SW3. The switch SW3 is coupled at one end to the global bit line GBL and at the other end to a node to which the precharge voltage Vpcp in the memory device 1 (for example, the voltage generator circuit 16) is applied. The switch SW3 is turned on or off in response to a control signal S3, and transfers the precharge voltage Vpcp to the global bit line GBL while it is on. The switch SW3 receives the control signal S3 from the read control circuit ROC, for example. The switch SW3 is, for example, a MOSFET.

The driver circuit RDPW is configured to apply a precharge voltage Vpcap to the global word line GWL. The precharge voltage Vpcap is higher than the ground voltage Vss and the high hold voltage VhdH and lower than the precharge voltage Vpcp. The precharge voltage Vpcap has a magnitude to turn on the switching element SE of a memory cell MC by applying a voltage having a magnitude of the precharge voltage Vpcap to the memory cell MC. The precharge voltage Vpcap also has a magnitude to allow only a current whose magnitude is smaller than that of an AP-direction switching current Icap to flow through the memory cell MC even by applying the precharge voltage Vpcap to the memory cell MC. The driver circuit RDPW may have any configuration as long as it can apply the precharge voltage Vpcap to the global word line GWL. For example, the driver circuit RDPW includes a switch SW6. The switch SW6 is coupled at one end to the global word line GWL and at the other end to a node to which the precharge voltage Vpcap in the memory device 1 (for example, the voltage generator 16) is applied. The switch SW6 is turned on or off in response to a control signal S6, and transfers the precharge voltage Vpcap to the global word line GWL while it is on. The switch SW6 receives the control signal S6 from the read control circuit ROC, for example. The switch SW6 is, for example, a MOSFET.

The driver circuit RDUB is configured to apply a non-selection voltage Vusel to the global bit line GBL. The non-selection voltage Vusel is higher than the ground voltage Vss and lower than the precharge voltage Vpcap and precharge voltage Vpcp. The non-selection voltage Vusel has a magnitude to inhibit the switching element SE of a memory cell MC from being turned on even by applying a voltage having a magnitude of the non-selection voltage Vusel to the memory cell MC. The non-selection voltage Vusel also has a magnitude to inhibit the switching element SE of a memory cell MC from being turned on even by applying a voltage having a magnitude of a difference between the precharge voltage Vpcp and the non-selection voltage Vusel to the memory cell MC. In addition, the non-selection voltage Vusel has a magnitude to inhibit the switching element SE of a memory cell MC from being turned on even by applying a voltage having a magnitude of a difference between the precharge voltage Vpcap and the non-selection voltage Vusel to the memory cell MC. The driver circuit RDUB may have any configuration as long as it can apply the non-selection voltage Vusel to the global bit line GBL. For example, the driver circuit RDUB includes a switch SW2. The switch SW2 is coupled at one end to the global bit line GBL and at the other end to a node to which the non-selection voltage Vusel in the memory device 1 (for example, the voltage generator 16) is applied. The switch SW2 is on or off in response to a control signal S2, and transfers the non-selection voltage Vusel to the global bit line GBL while it is turned on. The switch SW2 receives the control signal S2 from the read control circuit ROC, for example. The switch SW2 is, for example, a MOSFET.

The driver circuit RDUW is configured to apply a non-selection voltage Vusel to the global word line GWL. The driver circuit RDUW may have any configuration as long as it can apply the non-selection voltage Vusel to the global word line GWL. For example, the driver circuit RDUW includes a switch SW5. The switch SW5 is coupled at one end to the global word line GWL and at the other end to a node to which the non-selection voltage Vusel is applied. The switch SW5 is turned on or off in response to a control signal S5, and transfers the non-selection voltage Vusel to the global word line GWL while it is on. The switch SW5 receives the control signal S5 from the read control circuit ROC, for example. The switch SW5 is, for example, a MOSFET.

The read control circuit ROC controls the components in the read circuit RC. The read control circuit ROC operates in response to control signals generated by the control circuit 13 and the decode circuit 14 in response to the control signal CNT, command CMD and address signal ADD.

The sense amplifier circuit SAC is coupled to the global bit line GBL and the global word line GWL.

Figure 8:
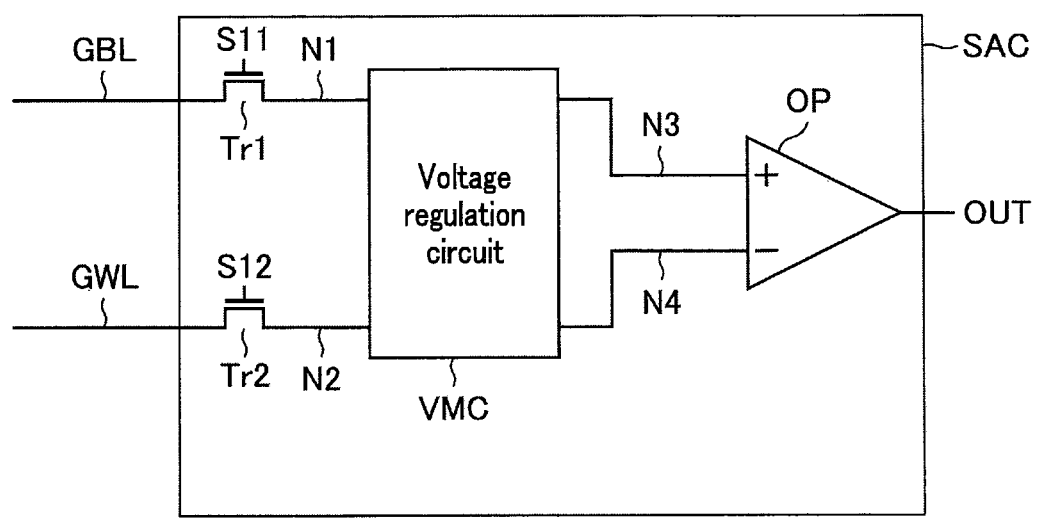
FIG. 8 shows components of a sense amplifier circuit of the first embodiment and connection of the components.

FIG. 8 shows components of the sense amplifier circuit SAC of the first embodiment and connection of the components. As shown in FIG. 8, sense amplifier circuit SAC includes transistors Tr1 and Tr2, a voltage regulation circuit VMC and an operational amplifier OP. The transistor Tr1 is coupled between a global bit line GBL and a node N1. The transistor Tr1 receives at its gate electrode a control signal S11 from the read control circuit ROC, for example.

The transistor Tr2 is coupled between a global word line GWL and a node N2. The transistor Tr2 receives at its gate electrode a control signal S12 from the read control circuit ROC, for example.

The operational amplifier OP is coupled to a node N3 at its non-inverting input terminal. The operational amplifier OP is coupled to a node N4 at its inverting input terminal. The output OUT of the operational amplifier OP is 1-bit data indicating data stored in a read-target memory cell MC in a memory cell array MA to which the operational amplifier OP is coupled.

The voltage regulation circuit VMC receives voltages, offsets the received voltages and outputs the offset voltage. The voltage regulation circuit VMC is coupled to the node N1 at its first input. The voltage regulation circuit VMC is coupled to the node N2 at its second input. The voltage regulation circuit VMC is coupled to the node N3 at its first output. The voltage regulation circuit VMC is coupled to the node N4 at its second output.

The voltage regulation circuit VMC is configured to allow for discrimination between a case where the voltages of the nodes N1 and N2 are substantially equal to each other and a case where the voltages of the nodes N1 and N2 are different from each other with the operational amplifier OP. Accordingly, the voltage regulation circuit VMC applies to the node N3 a voltage generated by regulating the voltage of the node N1 by a predetermined method, and/or applies to the node N4 a voltage generated by regulating the voltage of the node N2 by a predetermined method. The regulating method is optional, and an example thereof will be described below, with subsequent descriptions based on this example.

When the voltages of the nodes N1 and N2 are substantially the same, the voltage regulation circuit VMC offsets one of the voltages. The voltage regulation circuit VMC outputs at the node N3 the voltage of the node N1 or a voltage generated by offsetting the voltage of the node N1, and/or outputs at the node N4 the voltage of the node N2 or a voltage generated by offsetting the voltage of the node N2. Though the sentence "elements A and B are substantially the same" is intended to mean that elements A and B are the same, it is allowed to mean that elements A and B are not completely the same because of inevitable errors or the like.

The voltage regulation circuit VMC applies to the node N3 a voltage generated by offsetting the voltage of the node N1 by AV in the negative direction, and applies to the node N4 a voltage that is substantially the same as the voltage of the node N2. AV is smaller than the difference between the low hold voltage VhdL and the high hold voltage VhdH.

1.2. Operation

FIG. 9 shows the relationship between time and potentials of several interconnects during data reading from the memory device 1 of the first embodiment. FIG. 9 also shows one global bit line GBL and one global word line GWL which are coupled to a sub-core circuit SCC including a memory cell MC from which data is to be read (a read-target memory cell). FIG. 9 also shows, in its lower part, a current flowing through the read-target memory cell MC during data reading from the memory device 1 of the first embodiment as time passes. The lower part of FIG. 9 shows the direction of current flowing from the reference layer 35 to the storage layer 37, that is, the AP direction of the current, in the positive area of the current on the vertical axis. The lower part of FIG. 9 also shows the direction of current flowing from the storage layer 37 to the reference layer 35, that is, the P direction of the current, in the negative area of the current on the vertical axis. Hereinafter, a description that a voltage is applied to an interconnect means that the voltage is continuously applied to the interconnect until another voltage is applied thereto.

At the start of data read, the driver circuit RDUW applies a non-selection voltage Vusel to the global word line GWL and accordingly the global word line GWL is charged with the non-selection voltage Vusel. This can be done by maintaining the switch SW5 of the driver circuit RDUW in an on state and maintaining the other switches SW4 and SW6 in an off state. The driver circuit RDUB applies a non-selection voltage Vusel to the global bit line GBL and accordingly the global bit line GBL is charged with the non-selection voltage Vusel. This can be done by maintaining the switch SW2 of the driver circuit RDUW in an on state and maintaining the other switches SW1 and SW3 in an off state.

When data is read from the read-target memory cell MC, the read-target memory cell MC is coupled to the global bit line GBL via the local bit line LBL (conductor 22) and is coupled to the global word line GWL via the local word line LWL (conductor 21).

As shown in FIG. 9, a first sense period starts at time t0. At time t0, the driver circuit RDPW applies a precharge voltage Vpcap to the global word line GWL. This can be done by maintaining the switch SW6 of the driver circuit RDPW in an on state and maintaining the other switches SW4 and SW5 in an off state. By applying the precharge voltage Vpcap, the global word line GWL is charged with the precharge voltage Vpcap. After that, the switch SW1 of the driver circuit RDPW is turned off to bring the global word line GWL into a floating state.

At time t1, the sink circuit RDSB applies a ground voltage Vss to the global bit line GBL. This can be done by maintaining the switch SW4 of the sink circuit RDSB in an on state and maintaining the other switches SW5 and SW6 in an off state. This state is schematically shown in FIG. 10. As shown in FIG. 10, the global bit line GBL is decoupled from the node N1 by maintaining the transistor Tr1 in an off state. In addition, the global word line GWL is coupled to the node N2 by maintaining the transistor Tr2 in an on state. In FIG. 10 and its subsequent FIG. 11, no transistor that is off is depicted, but the transistor that is on is indicated by a solid line.

By applying the ground voltage Vss to the global bit line GBL, a voltage having a magnitude of Vpcap-Vss, that is, the precharge voltage Vpcap, is applied across both ends of the read-target memory cell MC. As a result, the switching element SE of the read-target memory cell MC is turned on and, as shown in the lower part of FIG. 9 and FIG. 10, read current Irap flows from the reference layer 35 toward the storage layer 37, that is, in the AP direction. The read current Irap lowers the potential of the global word line GWL, with the result that a difference in potential between both ends of the read-target memory cell MC is lowered. The magnitude of the read current Irap reaches a peak immediately after time t1 and then gradually decreases.

When the difference in potential between both ends of the read-target memory cell MC decreases to a certain value, the switching element SE of the read-target memory cell MC is turned off. As a result, when the switching element SE of the read-target memory cell MC is turned off, the potential of the global word line GWL is stored in the global word line GWL. The stored potential corresponds to one of the low hold voltage VhdL and high hold voltage VhdH, which is based upon the resistance state of the read-target memory cell MC. In addition, the transistor Tr2 of the sense amplifier circuit SAC is turned off, with the result that the potential of the global word line GWL is stored at the node N2.

As shown in FIG. 9, at time t2, a non-selection voltage Vusel is applied to the global word line GWL. At time t3, a non-selection voltage Vusel is applied to the global bit line GBL.

A reference data write and second sense period starts at time t4. At time t4, the driver circuit RDPB applies a precharge voltage Vpcp to the global bit line GBL. This can be done by maintaining the switch SW3 of the driver circuit RDPB in an on state and maintaining the other switches SW1 and SW2 in an off state. By applying the precharge voltage Vpcp, the global bit line GBL is charged with the precharge voltage Vpcp. After that, the switch SW3 of the driver circuit RDPB is turned off to bring the global bit line GBL into a floating state.

At time t5, the sink circuit RDSW applies a ground voltage Vss to the global word line GWL. This can be done by maintaining the switch SW4 of the sink circuit RDSW in an on state and maintaining the other switches SW5 and SW6 in an off state. This state is schematically shown in FIG. 11. As shown in FIG. 11, the global bit line GBL is coupled to the node N1 by maintaining the transistor Tr1 in an on state. In addition, the global word line GWL is decoupled from the node N2 by maintaining the transistor Tr2 in an off state.

By applying the ground voltage Vss to the global word line GWL, a voltage having a magnitude of Vpcp-Vss, that is, the precharge voltage Vpcp, is applied across both ends of the read-target memory cell MC. As a result, the switching element SE of the read-target memory cell MC is turned on and, as shown in the lower part of FIG. 9 and FIG. 11, read current Irp flows from the storage layer 37 toward the reference layer 35, that is, in the P direction. The read current Irp flows through the read-target memory cell MC. As described with reference to FIG. 7, the precharge voltage Vpcp is applied to one memory cell MC to allow a current whose magnitude is larger than that of the P-direction switching current Icp to flow through the memory cell MC. The magnitude of the read current Irp is thus larger than that of the P-direction switching current Icp. Therefore, the read current Irp brings the MTJ element MTJ of the read-target memory cell MC into a P state.

In addition, the read current Irp lowers the potential of the global bit line GBL, with the result that a difference in potential between both ends of the read-target memory cell MC is lowered. The magnitude of the read current Irp reaches a peak immediately after time t5 and then gradually decreases. The peak of the magnitude of the read current Irp is larger than that of the magnitude of the read current Irap.

When the difference in potential between both ends of the read-target memory cell MC decreases to a certain value, the switching element SE of the read-target memory cell MC is turned off. As a result, when the switching element SE of the read-target memory cell MC is turned off, the potential of the global bit line GBL is stored in the global bit line GBL. The stored potential corresponds to the low hold voltage VhdL because the MTJ element MTJ of the read-target memory cell MC is in a P state. In addition, the transistor Tr1 of the sense amplifier circuit SAC is turned off, with the result that the potential of the global bit line GBL is stored at the node N1.

As shown in FIG. 9, at time t6, a non-selection voltage Vusel is applied to the global bit line GBL. At time t7, a non-selection voltage Vusel is applied to the global word line GWL.

After time t5, the operational amplifier OP is enabled, for example, by the read control circuit ROC. Thus, the operational amplifier OP outputs output OUT whose magnitude is based upon the resistance state of the MTJ element MTJ of the read-target memory cell MC at the start of data read. That is, the operational amplifier OP outputs an L-level output OUT if the MTJ element MTJ is in a low-resistance state. On the other hand, the operational amplifier OP outputs an H-level output OUT if the MTJ element MTJ is in a high-resistance state. Reading of data stored in the read-target memory cell MC is thus completed.

1.3. Advantages (Advantageous Effects)

According to the first embodiment, a memory device that reads data in a short time can be provided, as described below.

For comparison and reference, an overview of a memory device 100 will be described. As in the first embodiment, data can be read by comparing a voltage generated by first sense and based upon data stored in a read-target memory cell and a voltage generated by second sense for a read-target memory cell to which reference data has been written. This method may be referred to as a self-reference method.

Figure 12:
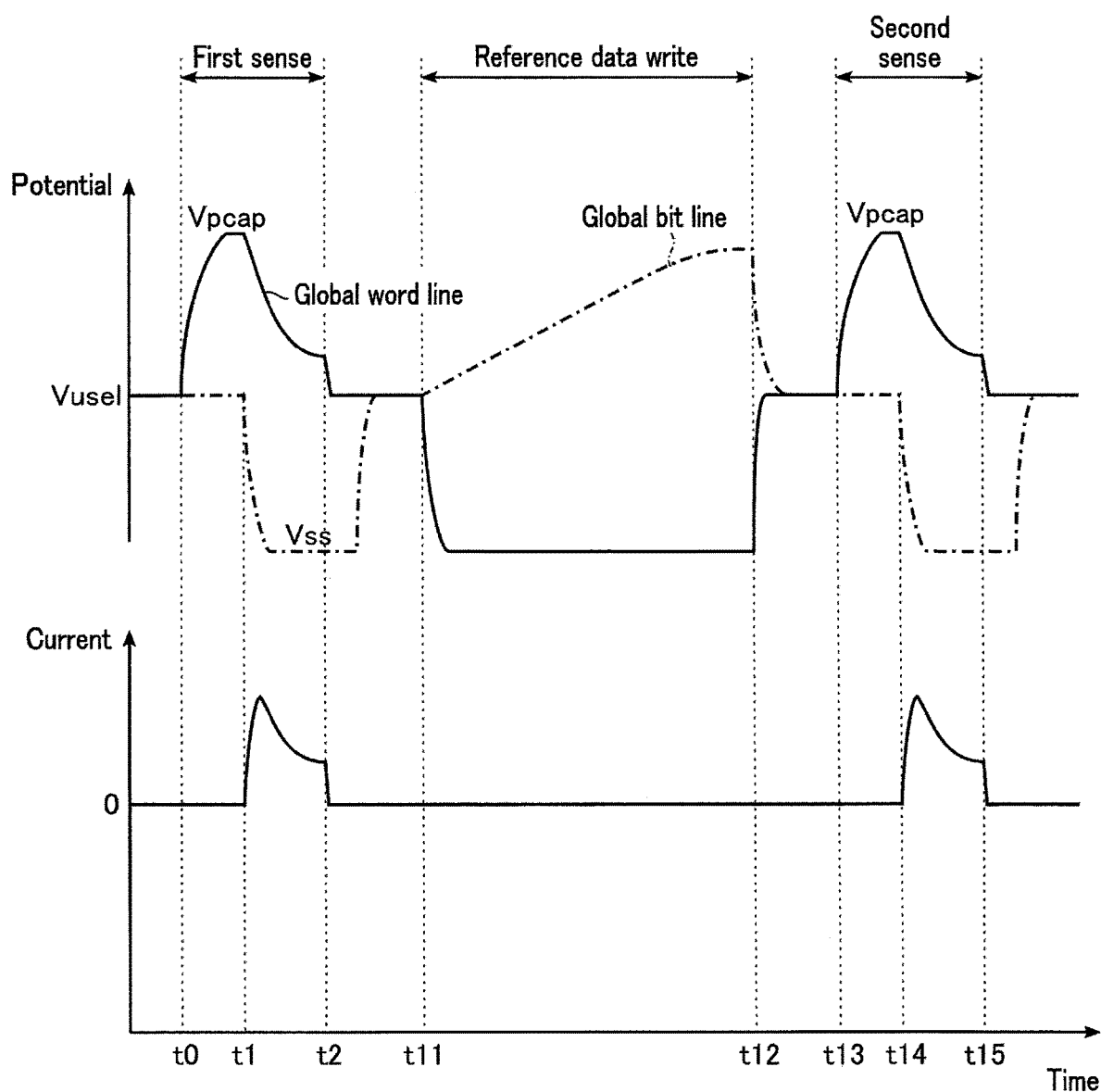
FIG. 12 shows the relationship between time and potentials of several lines during data reading from a reference memory device.

Like FIG. 9, FIG. 12 shows the relationship between time and potentials of several interconnects during data reading from the memory device 100. As shown in FIG. 12, the first sense is performed in a period from time t0 to time t2 by the same method as in the first embodiment (FIG. 9). In general, a switching current for bringing an MTJ element into an AP state is larger than that for bringing the MTJ element into a P state. In order to suppress a read disturbance, therefore, a read current for the first sense flows in the AP direction.

In a period from time t11 to time t12 after time t2, reference data is written. In a period from time t13 to time t15 after time t12, the second sense is performed in the same manner as the first sense from time t0 to time t2. A read current for the second sense also flows in the AP direction to suppress a read disturbance. After time t15, a signal indicating data stored in a read-target memory cell is obtained in the same manner as in the first embodiment, based on the voltage generated by the first sense and the voltage generated by the second sense. Reading data by the self-reference method can suppress variations in data read results due to inevitable variations in characteristics of memory cells. This is because a voltage based on "0" data or "1" data which is stored in the read-target memory cell but unknown is compared with a voltage generated when the read-target memory cell itself stores "0" data.

As is apparent from FIG. 12, however, reference data needs to be written for the self-reference method. This lengthens time required for reading data.

According to the first embodiment, no reference data is written after the first sense. Instead, the second sense is performed following the first sense. In the second sense, a read current Irp which flows in the P direction and brings the MTJ element MTJ of the read-target memory cell MC into a P state is caused to flow through the read-target memory cell MC. With the read current Irp, the MTJ element MTJ of the read-target memory cell MC is brought into a P state and then the second sense is performed for the read-target memory cell MC including the MTJ element MTJ in the P state. This data read does not require any dedicated time period for writing reference data, unlike in FIG. 12. Therefore, as is apparent from the comparison between FIG. 12 and FIG. 9 of the first embodiment, the first embodiment makes it possible to read data in a shorter time than in the memory device 100 for reference. Since, furthermore, the self-reference method is used, variations in data read results due to variations in characteristics of the memory cells are suppressed.

1.4. Modifications

The application of a voltage by the driver circuit RDUB, RDPB, RDUW or RDPW may be performed in a variety of methods. As a first one of the methods, a voltage desired to be applied by a driver circuit is generated, and the generated voltage is transferred to an interconnect via a switch, such as the switches SW2, SW3, SW5 and SW6, as described with reference to FIG. 7.

As a second one of the methods, a node with a reference voltage (for example, an internal power supply voltage) which differs from a voltage desired to be transferred is coupled to an interconnect via an n-type MOSFET. Then, the gate voltage of the MOSFET is adjusted to lower the reference voltage, with the result that a voltage desired to be transferred is generated and applied. Hereinafter, the second method may be referred to as a gate bias method.

2. Second Embodiment

The second embodiment is performed in addition to the first embodiment. The second embodiment relates to adjustment of resistance of a path through which read current flows.

2.1. Structure (Configuration)

The memory device 1b of the second embodiment includes a core circuit 11b instead of the core circuit 11 of the first embodiment.

Figure 13:
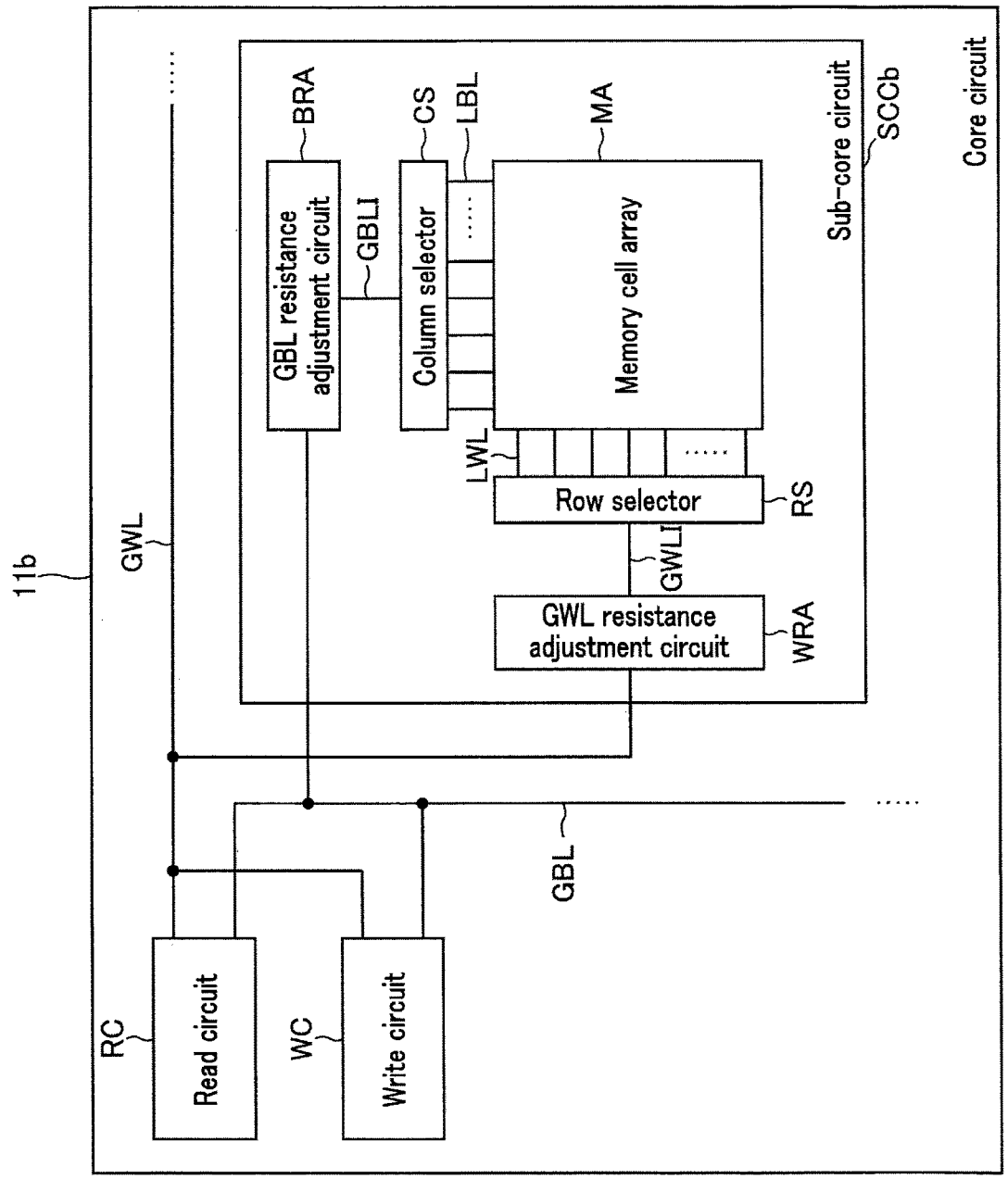
FIG. 13 shows functional blocks of a core circuit of a second embodiment.

FIG. 13 shows a functional block of the core circuit 11b of the second embodiment. Like FIG. 2 of the first embodiment, FIG. 3 simply shows one sub-core circuit SCC, one global word line GWL, one global bit line GBL, one read circuit RC and one write circuit WC. As shown in FIG. 3, the core circuit 11b includes one or more sub-core circuits SCCb. The sub-core circuits SCCb each include a sub-global word line GWLI, a GWL resistance adjustment circuit WRA, a sub-global bit line GBLI and a GBL resistance adjustment circuit BRA in addition to the memory cell array MA, row selector RS and column selector CS.

The row selector RS receives a row address and connects a corresponding one of the local word lines LWL of the memory cell array MA to the sub-global word line GWLI, based on the received row address.

The column selector CS receives a column address and connects a corresponding one of the local bit lines LBL of the memory cell array MA to the sub-global bit line GBLI, based on the received column address.

The GWL resistance adjustment circuit WRA adjusts resistance between the global word line GWL and the sub-global word line GWLI. The GWL resistance adjustment circuit WRA is coupled between the global word line GWL and the sub-global word line GWLI. The GWL resistance adjustment circuit WRA is configured to dynamically change the resistance between the global word line GWL and the sub-global word line GWLI. The GWL resistance adjustment circuit WRA receives a column address and dynamically changes the resistance between the global word line GWL and the sub-global word line GWLI, based on the received column address.

The GBL resistance adjustment circuit BRA adjusts resistance between the global bit line GBL and the sub-global bit line GBLI. The GBL resistance adjustment circuit BRA is coupled between the global bit line GBL and the sub-global bit line GBLI. The GBL resistance adjustment circuit BRA is configured to dynamically change the resistance between the global bit line GBL and the sub-global bit line GBLI. The GBL resistance adjustment circuit BRA receives a row address and dynamically changes the resistance between the global bit line GBL and the sub-global bit line GBLI, based on the received row address.

Figure 14:
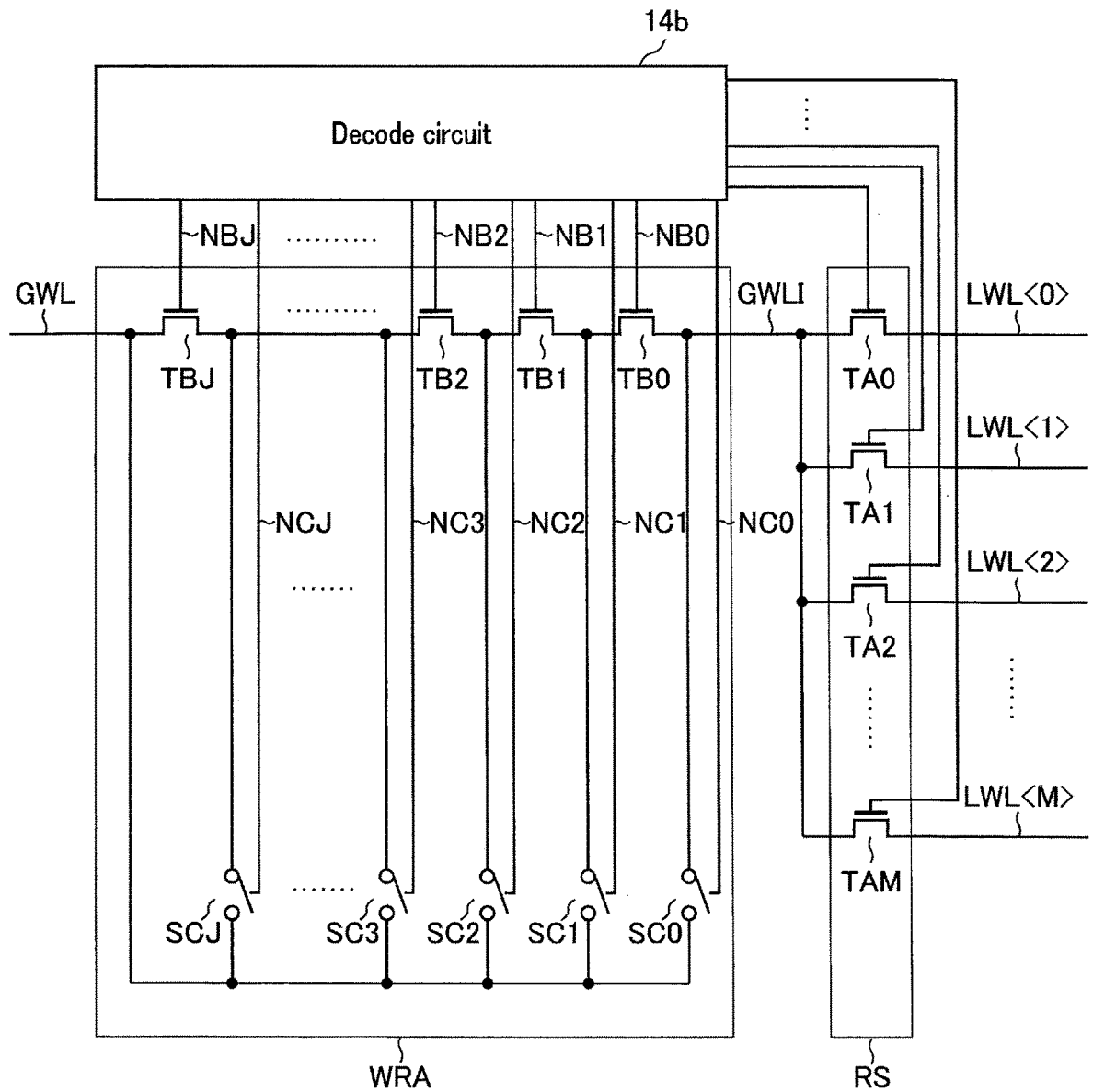
FIG. 14 is a circuit diagram of a GWL resistance adjustment circuit and a row selector of the second embodiment.

FIG. 14 is a circuit diagram of the GWL resistance adjustment circuit WRA and the row selector RS of the second embodiment. FIG. 14 also shows a decode circuit 14b of the second embodiment.

As shown in FIG. 14, the row selector RS includes n-type MOSFETs TA0 to TAM. Transistors TA0 to TAM are coupled at their one ends to local word lines LWL<0> to LWL<M>, respectively. Transistors TA0 to TAM are coupled at their other ends to the sub-global word line GWLI. The transistors TA0 to TAM each receive at its gate a control signal from the decode circuit 14b. When one of the control signals from the decode circuit 14b is asserted, one transistor TA receiving the asserted signal is coupled to the sub-global word line GWLI. The decode circuit 14b asserts one of the control signals supplied to the transistors TA0 to TAM, which is specified by a row address.

The transistors TA0 to TAN have substantially the same on-resistance. For that purpose, for example, the transistors TA0 to TAN have substantially the same dimensions and substantially the same concentration of impurities and are formed through a common process.

The GWL resistance adjustment circuit WRA includes n-type MOSFETs TB0 to TBJ and switches SC0 to SCJ, where J is an integer of 1 or more. Transistors TB0 to TBJ are coupled in series in ascending order of "α" in "TBα." The series structure of the transistors TB0 to TBJ is coupled to the sub-global word line GWLI at the transistor TB0 and is coupled to the global word line GWL at the transistor TBJ. The transistors TB0 to TBJ respectively receive control signals NB0 to NBJ at their gates from the decode circuit 14b. The decode circuit 14b generates the control signals NB0 to NBJ based on a column address.

The switch SC0 is coupled at one end to the sub-global word line GWLI and coupled at the other end to the global word line GWL. For each of cases of α is an integer of 1 or more and J or less, the switch SCα is coupled at its one end to a node to which transistors TBα and TBβ are coupled, and is coupled at its other end to the global word line GWL, where β is α−1. The switches SC0 to SCJ receive their respective control signals NC0 to NCJ from the decode circuit 14b and turn on or off based on the control signals NC0 to NCJ. The decode circuit 14b generates the control signals NC0 to NCJ based on a column address.

Figure 15:
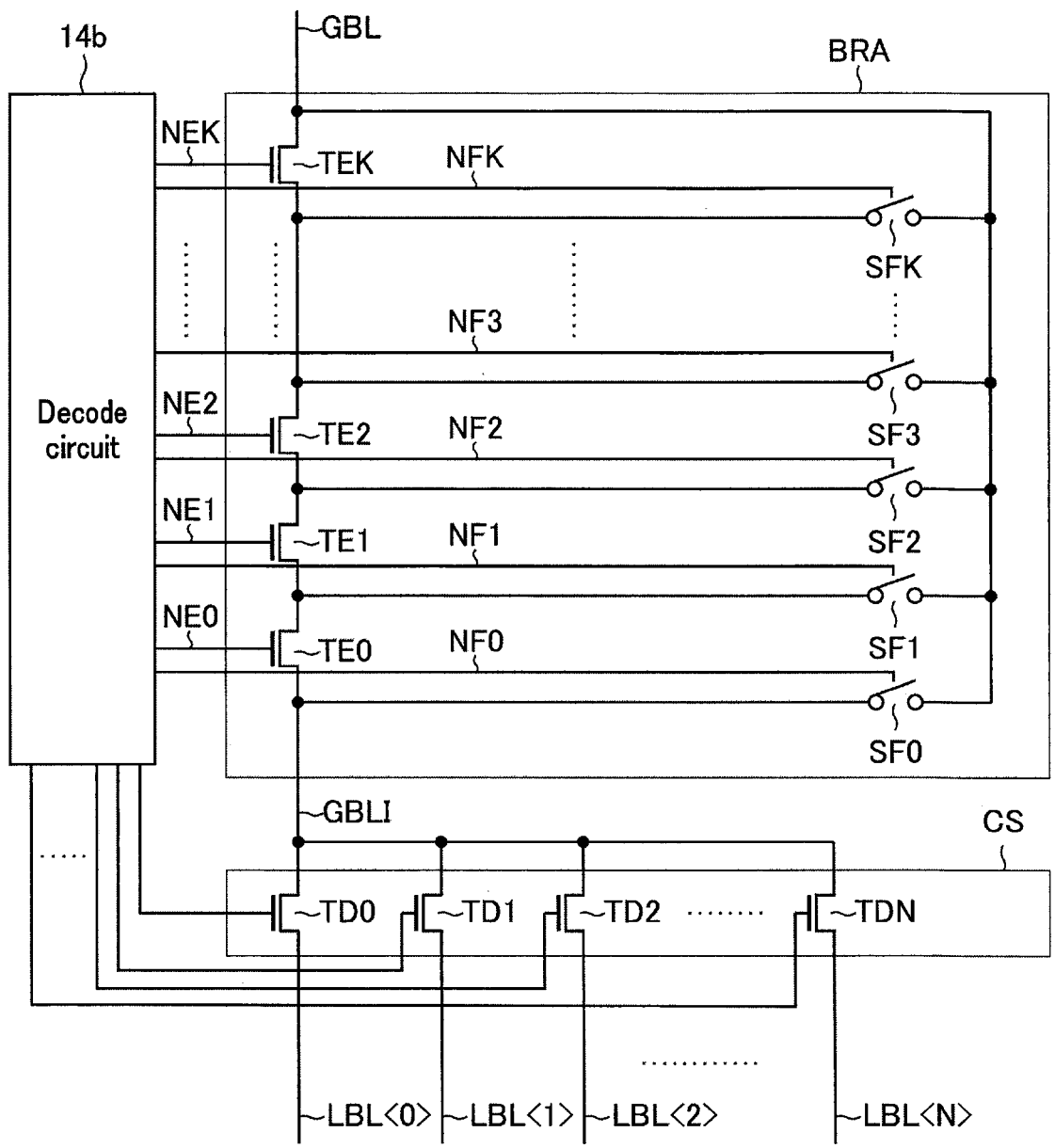
FIG. 15 is a circuit diagram of a GBL resistance adjustment circuit and a column selector of the second embodiment.

FIG. 15 is a circuit diagram of the GBL resistance adjustment circuit BRA and column selector CS of the second embodiment. FIG. 15 also shows the decode circuit 14b.

As shown in FIG. 15, the column selector CS includes n-type MOSFETs TD0 to TDN. Transistors TD0 to TDN are coupled at their ends to local bit lines LBL<0> to LBL<N>, respectively. The transistors TD0 to TDN are coupled at their other ends to the sub-global bit line GBLI. The transistors TD0 to TDN each receive at its gate a control signal from the decode circuit 14b. When one of the control signals from the decode circuit 14b is asserted, one transistor TD receiving the asserted signal is coupled to the sub-global bit line GBLI. The decode circuit 14b asserts one of the control signals supplied to the transistors TD0 to TDN, which is specified by a column address.

The transistors TD0 to TDN have substantially the same on-resistance. For that purpose, for example, the transistors TD0 to TDN have substantially the same dimensions and substantially the same concentration of impurities and are formed through a common process.

The GBL resistance adjustment circuit BRA includes n-type MOSFETs TE0 to TEK and switches SF0 to SFK, where K is an integer of 1 or more. Transistors TE0 to TEK are coupled in series in ascending order of "γ" in "TEγ." The series structure of the transistors TE0 to TEK is coupled to the sub-global bit line GBLI at the transistor TE0 and is coupled to the global bit line GBL at the transistor TEK. The transistors TE0 to TEK respectively receive control signals NE0 to NEK at their gates from the decode circuit 14b. The decode circuit 14b generates the control signals NE0 to NEK based on a row address.

The switch SF0 is coupled at one end to the sub-global bit line GBLI and coupled at the other end to the global bit line GBL. When γ is an integer of 1 or more and K or less, the switch SFγ is coupled at one end to a node to which transistors TEγ and TEε are coupled, and is coupled at the other end to the global bit line GBL, where ε is γ−1. The switches SF0 to SFK receive their respective control signals NF0 to NFK from the decode circuit 14b and turn on or off based on the control signals NF0 to NFK. The decode circuit 14b generates the control signals NF0 to NFK based on a row address.

Figure 16:
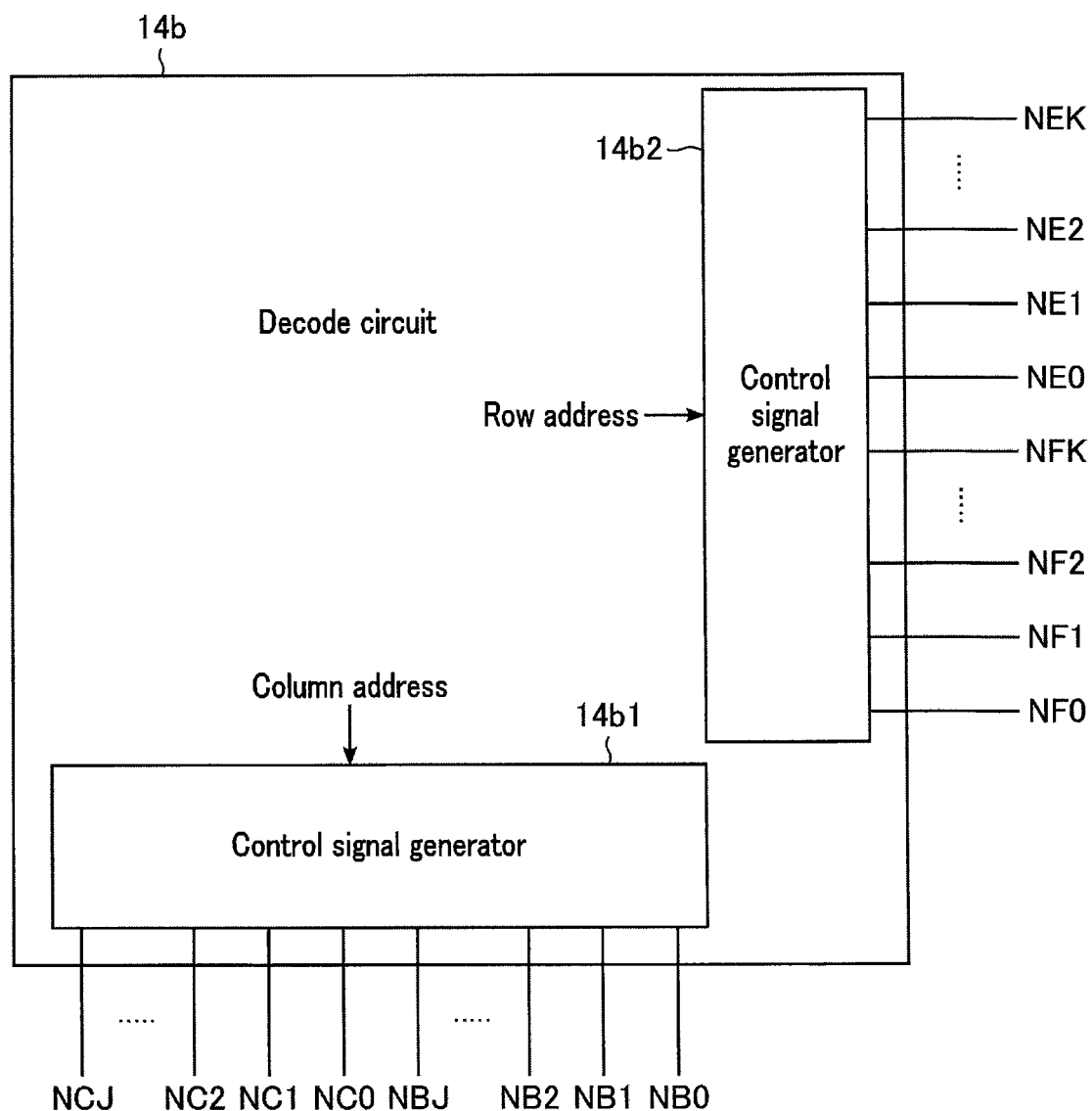
FIG. 16 shows functional blocks of a decode circuit of the second embodiment.

FIG. 16 shows functional blocks of the decode circuit 14b of the second embodiment. As shown in FIG. 16, the decode circuit 14b includes control signal generators 14b1 and 14b2. The control signal generator 14b1 receives a column address and generates control signals NB0 to NBJ and control signals NC0 to NCJ based on the received column address. The control signal generator 14b2 receives a row address and generates control signals NE0 to NEK and control signals NF0 to NFK based on the received row address.

2.2. Operation 2.2.1. GWL Resistance Adjustment Circuit WRA

Figure 17:
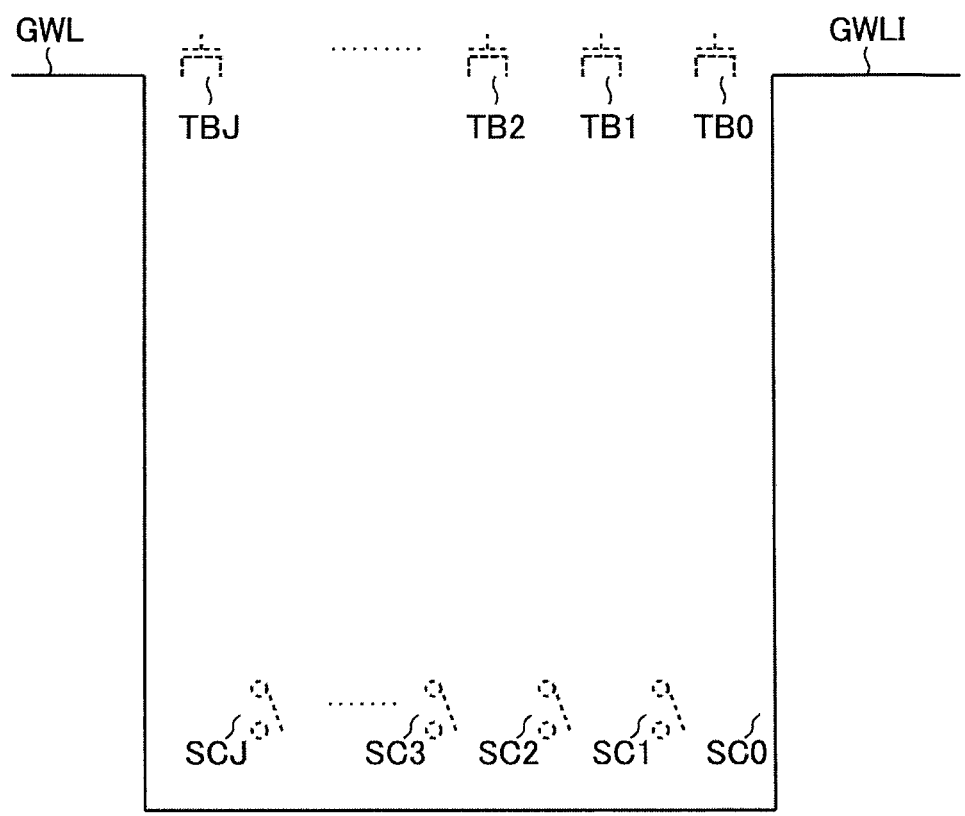
FIG. 17 shows an example of a state in which the GWL resistance adjustment circuit of the second embodiment is operating.
Figure 18:
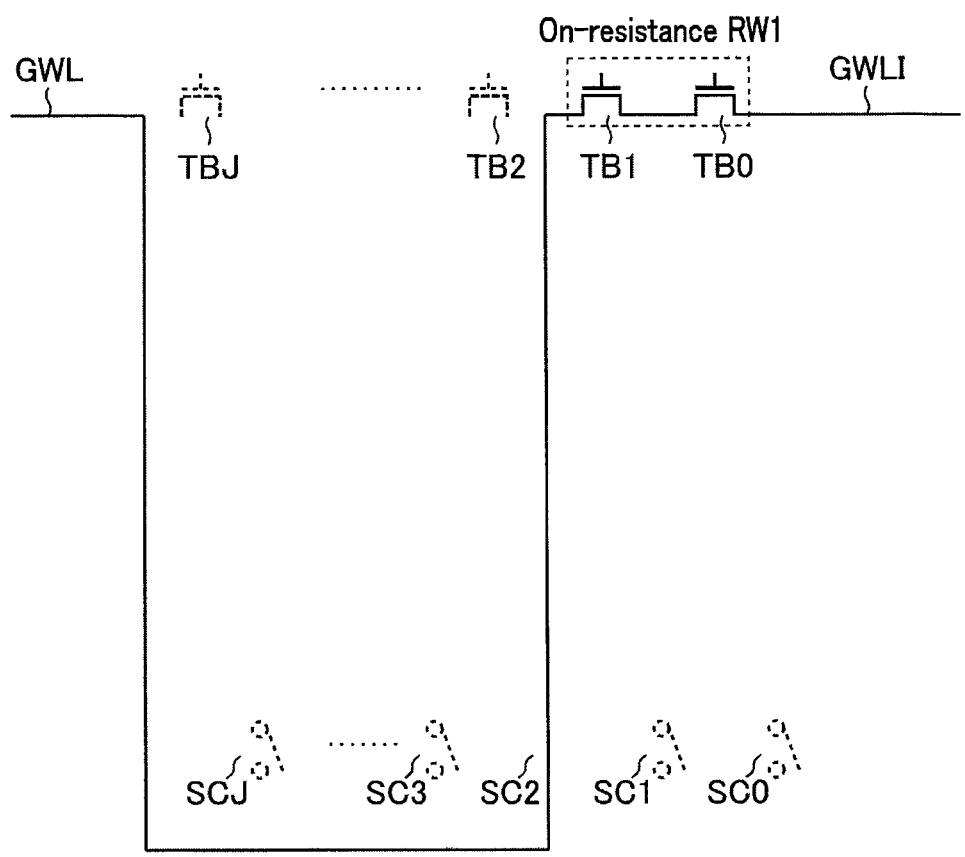
FIG. 18 shows an example of a state in which the GWL resistance adjustment circuit of the second embodiment is operating.

FIGS. 17 and 18 each show an example of a state during the operation of the GWL resistance adjustment circuit WRA of the second embodiment. FIGS. 17 and 18 each show an example of a state during first sense or reference data write and second sense. In FIGS. 17 and 18, a transistor TB in an off state and a switch SC in an off state are indicated by broken lines. In FIGS. 17 and 18, a transistor TB in an on state is indicated by a solid line. In FIGS. 17 and 18, a switch SC in an on state is indicated by a solid line coupling both ends of the switch SC.

The GWL resistance adjustment circuit WRA adjusts the resistance of a current path coupling the sub-global word line GWLI and global word line GWL using a combination of transistors TB0 to TBJ in an on or off state and switches SC0 to SCJ in an on or off state. For this reason, of the transistors TB0 to TBJ, all of 0 or more transistors TB coupled in series from the sub-global word line GWLI are turned on. In addition, of the switches SC0 to SCJ, only the switch SC coupled to a node to which the on-state transistor TB and the off-state transistor TB are coupled is turned on. Thus, the on-resistance of one or more on-state transistors TB are inserted in the current path coupling the sub-global word line GWLI and the global word line GWL. The resistance of the current path coupling the sub-global word line GWLI and the global word line GWL can dynamically be selected by selecting the number of transistors TB to be turned on among the transistors TB0 to TBJ.

In order to control the GWL resistance adjustment circuit WRA, the decode circuit 14b controls the assert and negate of the control signals NB0 to NBJ and control signals NC0 to NCJ based on a column address. More specifically, the decode circuit 14b turns on more transistors TB among the transistors TB0 to TBJ when the column address specifies a local bit line LBL that is farther from the row selector RS.

In the example shown in FIG. 17, all of the transistors TB0 to TBJ are turned off, and only the switch SC0 of the switches SC0 to SCJ is turned on. This can be done by negating all of the control signals NB0 to NBJ and asserting only the control signal NC0 of the control signals NC0 to NCJ. Since all of the transistors TB0 to TBJ are turned off and only the switch SC0 is turned on, no transistor TB is inserted in the current path coupling the sub-global word line GWLI and the global word line GWL. Therefore, the resistance of the current path coupling the sub-global word line GWLI and the global word line GWL does not include the on-resistance of any transistor TB.

In the example shown in FIG. 18, the transistors TB0 and TB1 are turned on, and only the switch SC2 of the switches SC0 to SCJ is turned on. This can be done by asserting only the control signals NB0 and NB1 of the control signals NB0 to NBJ and asserting only the control signal NC2 of the control signals NC0 to NCJ. Since the transistors TB0 and TB1 are turned on and only the switch SC2 is turned on, the transistors TB0 and TB1 are inserted in the current path coupling the sub-global word line GWLI and the global word line GWL. Thus, the resistance of the current path coupling the sub-global word line GWLI and the global word line GWL includes on-resistance RW1 of the sum of the on-resistances of the transistors TB0 and TB1. The following are generalized description. That is, the transistors TB0 to TBS are turned on, and only the switch SW$\eta$ of the switches SC0 to SCJ are turned on, where $\zeta$ is an integer of 0 or more and $\eta$ is $\zeta+1$.

2.2.2. GBL Resistance Adjustment Circuit BRA

The operation of the GBL resistance adjustment circuit BRA is similar to that of the GWL resistance adjustment circuit WRA.

Figure 19:
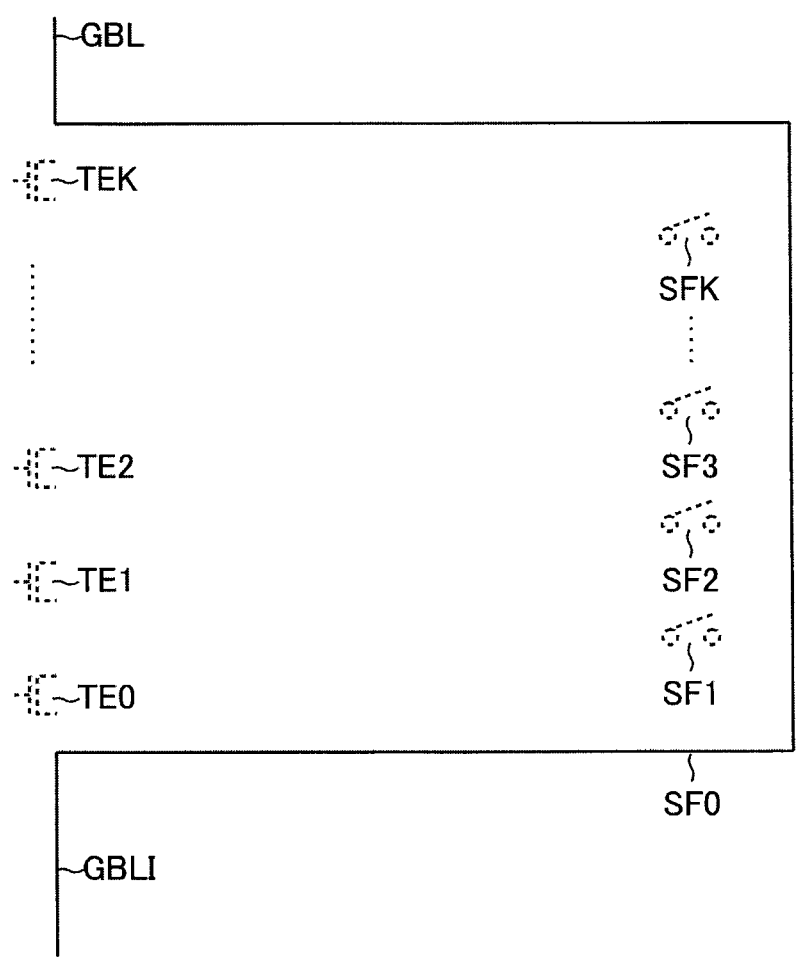
FIG. 19 shows an example of a state in which the GBL resistance adjustment circuit of the second embodiment is operating.

FIGS. 19 and 20 each show an example of a state during the operation of the GBL resistance adjustment circuit BRA of the second embodiment. FIGS. 19 and 20 each show an example of a state during first sense or reference data write and second sense. In FIGS. 19 and 20, a transistor TE in an off state and a switch SF in an off state are indicated by broken lines. In FIGS. 19 and 20, a transistor TE in an on state is indicated by a solid line. In FIGS. 19 and 20, a switch SF in an on state is indicated by a solid line coupling both ends of the switch SF.

The GBL resistance adjustment circuit BRA adjusts the resistance of a current path coupling the sub-global bit line GBLI and global bit line GBL using a combination of transistors TE0 to TEK in an on or off state and switches SF0 to SFK in an on or off state. For this reason, of the transistors TE0 to TEK, all of 0 or more transistors TE coupled in series from the sub-global bit line GBLI are turned on. In addition, of the switches SF0 to SFK, only the switch SF coupled to a node to which the on-state transistor TE and the off-state transistor TE are coupled, is turned on. Thus, the on-resistance of one or more on-state transistors TE are inserted in the current path coupling the sub-global bit line GBLI and the global bit line GBL. The resistance of the current path coupling the sub-global bit line GBLI and the global bit line GBL can dynamically be selected by selecting the number of transistors TE to be turned on among the transistors TE0 to TEK.

In order to control the GBL resistance adjustment circuit BRA, the decode circuit 14b controls the assert and negate of the control signals NE0 to NEK and control signals NF0 to NFK based on a row address. More specifically, the decode circuit 14b turns on more transistors TE among the transistors TE0 to TEK when the row address specifies a local word line LWL that is farther from the column selector CS.

In the example shown in FIG. 19, all of the transistors TE0 to TEK are turned off, and only the switch SF0 of the switches SF0 to SFK is turned on. This can be done by negating all of the control signals NE0 to NEK and asserting only the control signal NF0 of the control signals NF0 to NFK. Since all of the transistors TE0 to TEK are turned off and only the switch SF0 is turned on, no transistor TE is inserted in the current path coupling the sub-global bit line GBLI and the global bit line GBL. Therefore, the resistance of the current path coupling the sub-global bit line GBLI and the global bit line GBL does not include the on-resistance of any transistor TE.

In the example shown in FIG. 20, the transistors TE0, TE1 and TE2 are turned on, and only the switch SF3 of the switches SF0 to SFK is turned on. This can be done by asserting only the control signals NE0, NE1 and NE2 of the control signals NE0 to NEK and asserting only the control signal NF3 of the control signals NF0 to NFK. Since the transistors TE0, TE1 and TE2 are turned on and only the switch SF3 is turned on, the transistors TE0, TE1 and TE2 are inserted in the current path coupling the sub-global bit line GBLI and the global bit line GBL. Thus, the resistance of the current path coupling the sub-global bit line GBLI and the global bit line GBL includes on-resistance RB1 of the sum of the on-resistances of the transistors TE0, TE1 and TE2. The following are generalized description. That is, the transistors TE0 to TEθ are turned on, and only the switch SWι of the switches SF0 to SFK are turned on, where θ is an integer of 0 or more and ι is θ+1.

2.2.3. Resistance Adjustment Between First Sense and Second Sense

Figure 21:
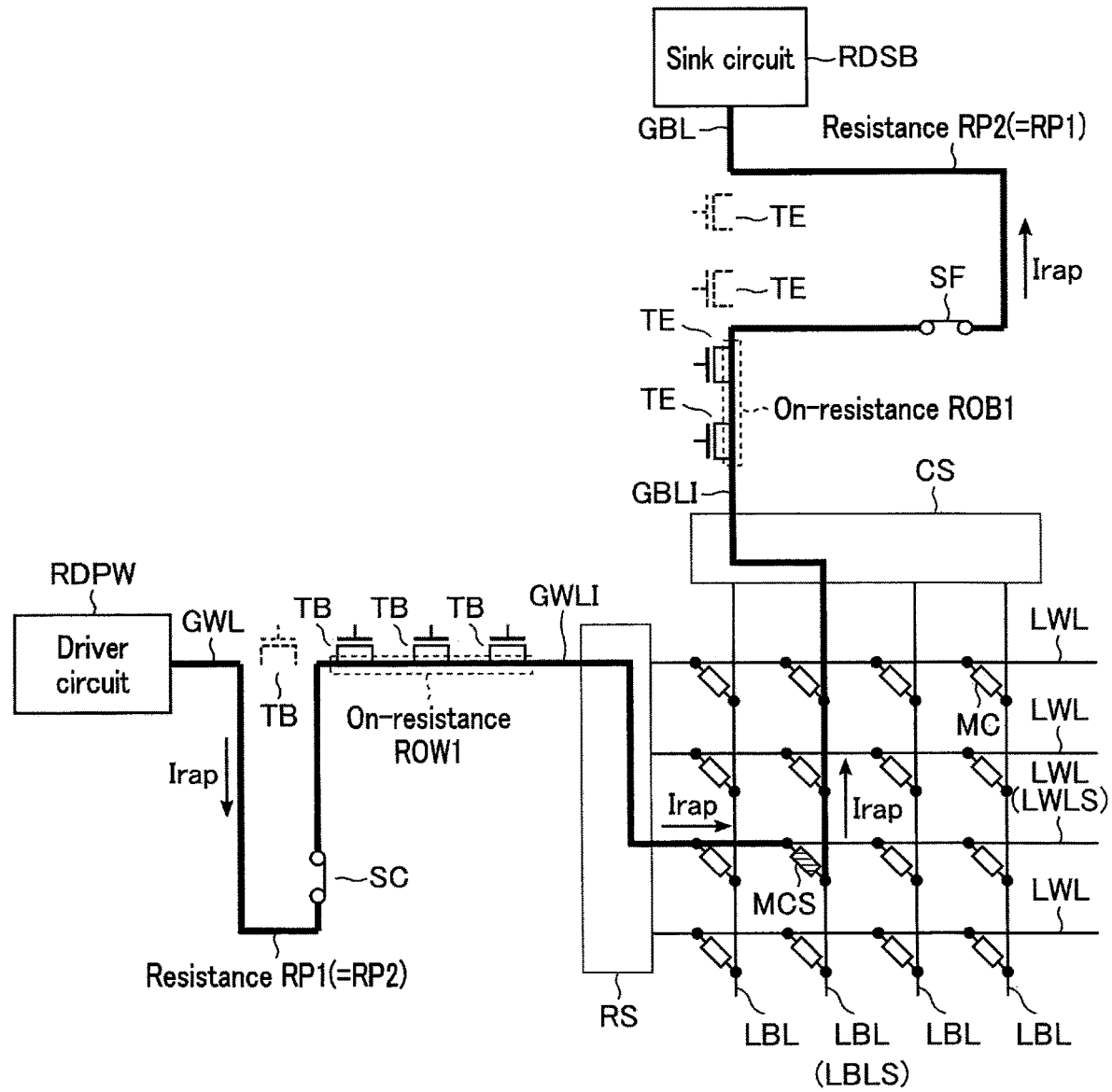
FIG. 21 shows an example of a state in which data is reading from the memory device of the second embodiment.

FIGS. 21 and 22 each show an example of a state during data read of the memory device of the second embodiment. Specifically, FIG. 21 shows an example of a state of the row selector RS, column selector CS, GWL resistance adjustment circuit WRA and GBL resistance adjustment circuit BRA during the first sense. FIG. 22 shows an example of a state of the row selector RS, column selector CS, GWL resistance adjustment circuit WRA and GBL resistance adjustment circuit BRA during the second sense.

FIGS. 21 and 22 each show an example where M=N=4, that is, an example where four memory cells MC are coupled to each local word line LWL and four memory cells are coupled to each local bit line LBL. In the example of FIGS. 21 and 22, a read-target memory cell MCS is coupled to a second local bit line LBL from the row selector RS and a third local word line LWL from the column selector CS. The local word line LWL coupled to the read-target memory cell MCS may be referred to as a selected local word line LWLS. The local bit line LBL coupled to the read-target memory cell MCS may be referred to as a selected local bit line LBLS.

As shown in FIGS. 21 and 22, the selected local word line LWLS is coupled to the sub-global word line GWLI by a turned-on transistor TA (not shown) coupled to the selected local word line LWLS in the row selector RS. The selected local bit line LBLS is coupled to the sub-global bit line GBLI by a turned-on transistor TD (not shown) coupled to the selected local bit line LBLS in the column selector CS.

As shown in FIG. 21 and as described with reference to FIG. 10, the global word line GWL is coupled to the driver circuit RDPW and the global bit line GBL is coupled to the sink circuit RDSB in order to perform the first sense.

The transistors TB the number of which is based on the fact that the selected local bit line LBLS is the second local bit line LBL from the row selector RS, are on. FIG. 21 shows an example in which three transistors TB are on. Of all the switches SC, only the switch SC coupled to a node to which a transistor TB that is on and a transistor TB that is off are coupled is on. In accordance with the states of the transistors TB and switch SC, resistance ROW1 of the sum of the on-resistances of three transistors TB is inserted between the sub-global word line GWLI and the global word line GWL. As a result, a current path (indicated by a thick line) coupling the read-target memory cell MCS and the driver circuit RDPW has resistance RP1 of a certain magnitude.

The transistors TE the number of which is based on the fact that the selected local word line LWLS is the third local word line LWL from the column selector CS are on. FIG. 21 shows an example in which two transistors TE are on. Of all the switches SF, only the switch SF coupled to a node to which a transistor TE that is on and a transistor TE that is off are coupled, is on. In accordance with the states of the transistors TE and switch SF, resistance ROB1 of the sum of the on-resistances of two transistors TE is inserted between the sub-global bit line GBLI and the global bit line GBL. As a result, a current path (indicated by a thick line) coupling the read-target memory cell MCS and the sink circuit RDSB has resistance RP2 of a certain magnitude.

The resistances RP1 and RP2 have substantially the same magnitude. In other words, the on-resistances ROW1 and ROB1 are formed to minimize a difference between the resistances RP1 and RP2, that is, the number of transistors TB to be turned on and the number of transistors TE to be turned on are selected to form the on-resistances ROW1 and ROB1.

The number of transistors TB to be turned on depends on the selected local bit line LBLS. The selected local bit line LBLS is specified by a column address specifying data read. Thus, the number of transistors TB to be turned on depends on the column address. The decode circuit 14b generates control signals NB0 to NBJ and control signals NC0 to NCJ based on the column address.

Similarly, the number of transistors TE to be turned on depends on the selected local word line LWLS. The selected local word line LWLS is specified by a row address specifying data read. Thus, the number of transistors TE to be turned on depends on the row address. A decode circuit 14b generates control signals NE0 to NEK and control signals NF0 to NFK based on the row address.

As shown in FIG. 22 and as described with reference to FIG. 11, the global word line GWL is coupled to the sink circuit RDSW and the global bit line GBL is coupled to the driver circuit RDPB in order to perform the reference data write and second sense. The coupling of the other components is the same as that in FIG. 21. Therefore, the current path (indicated by a thick line) coupling the read-target memory cell MCS and the sink circuit RDSW has resistance RP1. In addition, the current path (indicated by a thick line) coupling the read-target memory cell MCS and the driver circuit RDPB has resistance RP2.

In each of the periods of the first sense shown in FIG. 21 and the reference data write and second sense shown in FIG. 22, the resistance (RP1 or RP2) of the current path coupling the read-target memory cell MCS and the driver circuit (RDPW or RDPB) is substantially the same as the resistance (RP1 or RP2) of the current path coupling the read target memory cell MCS and the sink circuit (RDSB or RDSW). Thus, the resistance of the current path coupling the driver circuit (RDPW) and the-read target memory cell MCS when the read current Irap flows, that is, the resistance RP1 of FIG. 21, is substantially the same as the resistance of the current path coupling the driver circuit (RDPB) and the read-target memory cell MCS when the read current Irp flows, that is, the resistance RP2 of FIG. 22. Similarly, the resistance of the current path coupling the read-target memory cell MCS and the sink circuit (RDSB) when the read current Irap flows, that is, the resistance RP2 of FIG. 21, is substantially the same as the resistance of the current path coupling the read-target memory cell MCS and the sink circuit (RDSW) when the read current Irp flows, that is, the resistance RP1 of FIG. 22. Thus, the resistance of the current path coupling the read target memory cell MCS and the driver circuit and the resistance of the current path coupling the read-target memory cell MCS and the sink circuit are both substantially the same when the read current Iraq flows as when the read current Irp flows.

2.3. Advantages

Like in the first embodiment, in the second embodiment, after the first sense, the second sense is performed in which a read current Irp that flows in the P direction and brings the MTJ element MTJ of a read-target memory cell MC into a P state is caused to flow through the read-target memory cell MC. Therefore, the same advantages as those of the first embodiment can be obtained.

The memory device 1b of the second embodiment includes a GWL resistance adjustment circuit WRA and a GBL resistance adjustment circuit BRA. In the GWL resistance adjustment circuit WRA, a variable number of on-transistors TB can be inserted between the sub-global word line GWLI and the global word line GWL. In the GBL resistance adjustment circuit BRA, a variable number of on-transistors TE can be inserted between the sub-global bit line GBLI and the global bit line GBL. The GWL resistance adjustment circuit WRA and GBL resistance adjustment circuit BRA adjust the number of transistors TB and TE that are on such that the resistance of a current path coupling a read-target memory cell MCS and a driver circuit is substantially equal to that of a current path coupling the read-target memory cell MCS and a sink circuit in both the first sense and second sense. Thus, these resistances are substantially the same in the case where the read current Irap flows and in the case where the read current Irp flows. Thus, a difference between a low hold voltage VhdL generated by the first sense for the read-target memory cell MCS and a low hold voltage VhdL generated by the second sense for the read-target memory cell MCS is suppressed. This allows data to be read accurately. Therefore, data can be read with high accuracy even though the direction in which the read current flows varies between the first sense and the second sense.

3. Third Embodiment

The third embodiment relates to data write.

3.1. Configuration

FIG. 23 shows components of a write circuit WC of the third embodiment and a coupling of the components. As shown in FIG. 23, the write circuit WC includes a write control circuit WOC, driver circuits WDUB, WDPB, WDUW and WDPW, and sink circuits WDSB and WDSW. FIG. 23 shows only the components for one global bit line GBL and one global word line GWL. The driver circuits WDUB and WDPB and sink circuit WDSB are also provided for the other global bit lines GBL. The driver circuits WDUW and WDPW and sink circuit WDSW are also provided for the other global word lines GWL.

The sink circuit WDSB is configured to apply a ground voltage VSS to the global bit line GBL. The function and/or configuration of the sink circuit WDSB is the same as that of the sink circuit RDSB except that a switch SW 21 is provided in place of the switch SW1 and a control signal S21 is used in place of the control signal S1. Among the descriptions of the sink circuit RDSB of the first embodiment, the descriptions with "SW1" and "S1" replaced respectively with "SW21" and "S21" apply to the sink circuit WDSB. The switch SW21 receives the control signal S21 from the write control circuit WOC, for example. The sink circuit RDSB may be used in place of the sink circuit WDSB.

The sink circuit WDSW is configured to apply a ground voltage VSS to the global word line GWL. The function and/or configuration of the sink circuit WDSW is the same as that of the sink circuit RDSW except that a switch SW24 is provided in place of the switch SW4 and a control signal S24 is used in place of the control signal S4. Among the descriptions of the sink circuit RDSW of the first embodiment with "SW4" and "S4" replaced respectively with "SW24" and "S24" apply to the sink circuit WDSW. The switch SW24 receives the control signal S24 from the write control circuit WOC, for example. The sink circuit RDSW may be used in place of the sink circuit WDSW.

The driver circuit WDPB is configured to apply a write voltage Vwp to the global bit line GBL. The write voltage Vwp has a magnitude that, when applied to one memory cell MC, turns on the switching element SE of the memory cell MC and allows a P write current Iwp to flow through the memory cell MC. The write voltage Vwp may be the same as the precharge voltage Vpcp. The driver circuit WDPB may have any configuration as long as it can apply the write voltage Vwp to the global bit line GBL. For example, the driver circuit WDPB includes a switch SW23. The switch SW23 is coupled at one end to the global bit line GBL and at the other end to a node in the memory device 1 (for example, in the voltage generator 16) to which the write voltage Vwp is applied. The switch SW23 turns on or off based on the control signal S23, and transfers the write voltage Vwp to the global bit line GBL while it is on. The switch SW23 receives the control signal S23 from the write control circuit WOC, for example. The switch SW23 is, for example, a MOSFET.

The driver circuit WDPW is configured to apply a write voltage Vwap to the global word line GWL. The write voltage Vwap has a magnitude that, when applied to one memory cell MC, turns on the switching element SE of the memory cell MC and allows an AP write current Iwap to flow through the memory cell MC. The driver circuit WDPW may have any configuration as long as it can apply the write voltage Vwap to the global word line GWL. For example, the driver circuit WDPW includes a switch SW26. The switch SW26 is coupled at one end to the global word line GWL and at the other end to a node in the memory device 1 (for example, in the voltage generator 16) to which the write voltage Vwap is applied. The switch SW26 turns on or off based on the control signal S26, and transfers the write voltage Vwap to the global word line GWL while it is on. The switch SW26 receives the control signal S26 from the write control circuit WOC, for example. The switch SW26 is, for example, a MOSFET.

The write voltage Vwp may be the same as the write voltage Vwap.

The driver circuit WDUB is configured to apply a non-selection voltage Vusel to the global bit line GBL. The function and/or configuration of the driver circuit WDUB is the same as that of the driver circuit RDUB except that a switch SW22 is provided in place of the switch SW2 and a control signal S22 is used in place of the control signal S2. Among the descriptions of the driver circuit RDUB of the first embodiment, the descriptions with "SW2" and "S2" replaced respectively with "SW22" and "S22" apply to the driver circuit WDUB. The switch SW22 receives the control signal S22 from the write control circuit WOC, for example. The driver circuit RDUB may be used in place of the driver circuit WDUB.

The driver circuit WDUW is configured to apply a non-selection voltage Vusel to the global word line GWL. The function and/or configuration of the driver circuit WDUW is the same as that of the driver circuit RDUW except that a switch SW25 is provided in place of the switch SW5 and a control signal S25 is used in place of the control signal S5. Among the descriptions of the driver circuit RDUW of the first embodiment, the descriptions with "SW5" and "S5" replaced respectively with "SW25" and "S25" apply to the driver circuit WDUW. The switch SW25 receives the control signal S25 from the write control circuit WOC, for example. The driver circuit RDUW may be used in place of the driver circuit WDUW.

The write control circuit WOC controls the components in the write circuit WC. The write control circuit WOC operates based on control signals generated by the control circuit 13 and decode circuit 14 based on the control signal CNT, command CMD and address signal ADD.

3.2. Operation

Figure 24:
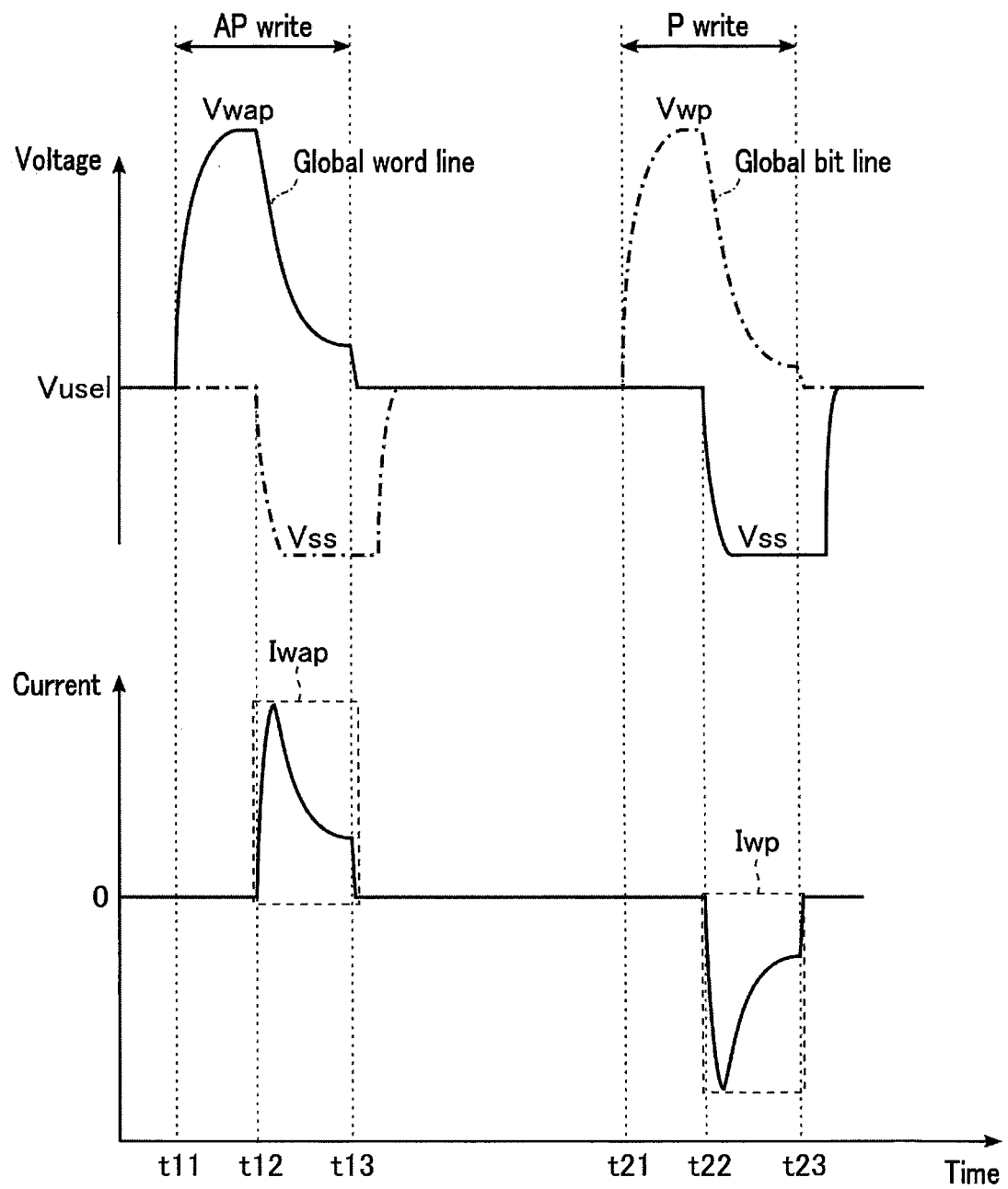
FIG. 24 shows the relationship between time and potentials of several lines during data write to a memory device of the third embodiment.

FIG. 24 shows the relationship between time and potentials of several lines during data write to a memory device 1c of the third embodiment. FIG. 24 also shows one global bit line GBL and one global word line GWL which are coupled to the sub-core circuit SCC including a memory cell to which data is to be written (write-target memory cell) MC. FIG. 24 also shows, in its lower part, a current flowing through the read-target memory cell MC during data write to the memory device 1 of the third embodiment as time passes. Like the lower part of FIG. 9, the lower part of FIG. 24 shows current flowing in the AP direction in the positive area of the current on the vertical axis, and current flowing in the P direction in the negative area of the current on the vertical axis.

In FIG. 24, P write following AP write is shown for the sake of convenience. The P write following AP write is not required.

The overview of data write is similar to that of reference data write described with reference to FIG. 9 in the first embodiment. Hereinafter, differences from the reference data write will mainly be described.

At the start of AP write or P write, the global word line GWL is already charged with the non-selection voltage Vusel by the driver circuit WDUW. This can be done by maintaining the switch SW25 of the driver circuit WDUW on and maintaining the other switches SW24 and SW26 off. In addition, the global bit line GBL is already charged with the non-selection voltage Vusel by the driver circuit WDUB. This can be done by maintaining the switch SW22 of the driver circuit WDUB on and maintaining the other switches SW21 and SW23 off.

Upon the start of data write to a write-target memory cell MC, the write-target memory cell MC is coupled to the global bit line GBL via the local bit line LBL (conductor 22) and coupled to the global word line GWL via the local word line LWL (conductor 21).

At time t11, the driver circuit WDPW applies a write voltage Vwap to the global word line GWL. This can be done by maintaining the switch SW26 of the driver circuit WDPW on and the other switches SW24 and SW25 off. By applying the write voltage Vwap, the global word line GWL is charged with the write voltage Vwap. After that, the switch SW26 of the driver circuit WDPW is turned off to bring the global word line GWL into a floating state.

At time t12, the sink circuit WDSB applies a ground voltage Vss to the global bit line GBL. This can be done by maintaining the switch SW21 of the sink circuit WDSB on and maintaining the other switches SW22 and SW23 off. By applying the ground voltage Vss to the global bit line GBL, a voltage having a magnitude of Vwap-Vss, that is, a write voltage Vwap, is applied across both ends of a write-target memory cell MC. This voltage has a magnitude to turn on the switching element SE of the write-target memory cell MC. Accordingly, the write current Iwap flows in the AP direction.

As described with reference to FIG. 23, the write current Iwap is larger than the AP-direction switching current Icap. Therefore, when the write current Iwap flows through the write-target memory cell MC, the MTJ element MTJ of the write-target memory cell MC is brought into an AP state.

Furthermore, the write current Iwap lowers the potential of the global word line GWL, with the result that a potential difference between both ends of the write-target memory cell MC decreases. When the potential difference decreases to a high hold voltage VhdH, the switching element SE of the write-target memory cell MC is turned off. Thus, the AP write is completed.

From time t13, the non-selection voltage Vusel is applied to the global word line GWL, then to the global bit line GBL.

At time t21, the driver circuit WDPB applies a write voltage Vwp to the global bit line GBL. This can be done by maintaining the switch SW23 of the driver circuit WDPB on and maintaining the other switches SW21 and SW22 off. By applying the write voltage Vwp, the global bit line GBL is charged with the write voltage Vwp. After that, the switch SW23 of the driver circuit WDPB is turned off to bring the global bit line GBL in a floating state.

At time t22, the sink circuit WDSW applies a ground voltage Vss to the global word line GWL. This can be done by maintaining the switch SW24 of the sink circuit WDSW on and maintaining the other switches SW25 and SW26 off. By applying the ground voltage Vss to the global word line GWL, a voltage having a magnitude of Vwp-Vss, that is, a write voltage Vwp, is applied across both ends of a write-target memory cell MC. This voltage has a magnitude to turn on the switching element SE of the write-target memory cell MC. Accordingly, the write current Iwp flows in the P direction.

As described with reference to FIG. 23, the write current Iwp is larger than the P-direction switching current Icp. Therefore, when the write current Iwp flows through the write-target memory cell MC, the MTJ element MTJ of the write-target memory cell MC is brought into a P state.

Furthermore, the write current Iwp lowers the potential of the global bit line GBL, with the result that a potential difference between both ends of the write-target memory cell MC decreases. When the potential difference decreases to a low hold voltage VhdL, the switching element SE of the write-target memory cell MC is turned off. Thus, the P write is completed.

From time t23, the non-selection voltage Vusel is applied to the global bit line GBL, then to the global word line GWL.

3.3. Advantages

According to the third embodiment, during data write, as with the first sense and second sense, one of the global word line GWL and global bit line GBL is charged and then floated, and then the other of the global word line GWL and global bit line GBL is brought into a ground voltage Vss. Also with such voltage application, data can be written to the memory cell MC.

3.4. Modification

Like in the modification to the first embodiment, the driver circuit WDPB and/or driver circuit WDPW may be implemented using a gate bias method.

The third embodiment can be combined with the first embodiment or the second embodiment. When the third embodiment is combined with the first embodiment, some driver circuits can be implemented using one driver circuit and a gate bias method. The function of the driver circuit RDPB for applying a precharge voltage Vpcp to the global bit line GBL in the read circuit RC and the function of the driver circuit WDPB for applying a write voltage Vwp to the global bit line GBL in the write circuit WC are implemented by one driver circuit. In this case, the driver circuit includes, for example, an n-type MOSFET coupled to the node of a power supply voltage and the global bit line GBL. The MOSFET receives at its gate different voltages when the precharge voltage Vpcp is applied to the global bit line GBL and when the write voltage Vwp is applied.

The function of the driver circuit RDPW for applying the precharge voltage Vpcap to the global word line GWL in the read circuit RC and the function of the driver circuit WDPW for applying the write voltage Vwap to the global word line GWL in the write circuit WC can be implemented by one driver circuit. In this case, the driver circuit includes, for example, an n-type MOSFET coupled to the node of a power supply voltage and the global word line GWL. The MOSFET receives at its gate different voltages when the precharge voltage Vpcap is applied to the global word line GWL and when the write voltage Vwap is applied.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A memory device comprising:
a first interconnect;
a second interconnect;
a memory cell coupled between the first interconnect and the second interconnect and including a variable resistance element and a switching element, the variable resistance element including a first ferromagnetic layer, a second ferromagnetic layer, and an insulating layer between the first ferromagnetic layer and the second ferromagnetic layer;
a first circuit configured to apply a first voltage to the first interconnect;
a second circuit configured to apply a second voltage to the second interconnect;
a third circuit configured to apply a third voltage to the second interconnect;
a fourth circuit configured to apply a fourth voltage to the first interconnect; and
a sense amplifier circuit coupled to the first interconnect and the second interconnect.

2. The memory device of claim 1, wherein:
the sense amplifier circuit includes an operational amplifier; and
the operational amplifier receives a voltage based on a potential of the first interconnect at a non-inverting input terminal, and receives a voltage based on a potential of the second interconnect at an inverting input terminal.

3. The memory device of claim 1, wherein:
the memory device is configured to perform a first operation and a second operation;
in the first operation, the first voltage is applied to the first interconnect, the first interconnect is brought into a floating state after the application of the first voltage, and the second voltage is applied to the second interconnect while the first interconnect is in the floating state; and
in the second operation, the third voltage is applied to the second interconnect, the second interconnect is brought into a floating state after the application of the third voltage, and the fourth voltage is applied to the first interconnect while the second interconnect is in the floating state.

4. The memory device of claim 3, wherein:
the memory device is configured to perform a third operation; and
in the third operation, a fifth voltage, which is higher than the second voltage and the fourth voltage and which is lower than the first voltage and the third voltage, is applied to the first interconnect and the second interconnect.

5. The memory device of claim 4, wherein:
the first operation is followed by the third operation; and
the third operation is followed by the second operation.

6. The memory device of claim 1, wherein the first voltage is lower than the third voltage.

7. The memory device of claim 1, wherein:
the variable resistance element has a first resistance due to a current flowing through the variable resistance element from the first interconnect toward the second interconnect;
the variable resistance element has a second resistance due to a current flowing through the variable resistance element from the second interconnect toward the first interconnect; and
the first resistance is higher than the second resistance.

8. The memory device of claim 1, wherein:
the first interconnect includes a first sub-interconnect and a second sub-interconnect;
the second interconnect includes a third sub-interconnect and a fourth sub-interconnect; and
the memory device further comprises:
a first variable resistance between the first sub-interconnect and the second sub-interconnect; and
a second variable resistance between the third sub-interconnect and the fourth sub-interconnect.

9. The memory device of claim 8, wherein:
the first variable resistance includes:
a plurality of first transistors coupled in series between the first sub-interconnect and the second sub-interconnect;
a first switch coupled between the first sub-interconnect and the second sub-interconnect; and
a plurality of second switches each of which is coupled between the first sub-interconnect and a node to which two of the first transistors are coupled; and
the second variable resistance includes:
a plurality of second transistors coupled in series between the third sub-interconnect and the fourth sub-interconnect;
a third switch coupled between the third sub-interconnect and the fourth sub-interconnect; and
a plurality of fourth switches each of which is coupled between the third sub-interconnect and a node to which two of the second transistors are coupled.

10. A memory device comprising:
a first interconnect;
a second interconnect;
a memory cell coupled between the first interconnect and the second interconnect and including a variable resistance element and a switching element, the variable resistance element including a first ferromagnetic layer, a second ferromagnetic layer, and an insulating layer between the first ferromagnetic layer and the second ferromagnetic layer; and
a first circuit configured to:
perform a first operation and a second operation;
apply a first voltage to the first interconnect, bring the first interconnect into a floating state after the application of the first voltage, and apply a second voltage to the second interconnect while the first interconnect is in the floating state, in the first operation, the second voltage being lower than the first voltage; and apply a third voltage to the second interconnect, bring the second interconnect into a floating state after the application of the third voltage, and apply a fourth voltage to the first interconnect while the second interconnect is in the floating state, in the second operation, the third voltage being different from the first voltage, the fourth voltage being lower than the third voltage.

11. The memory device of claim 10, wherein the first circuit is configured to:

perform a third operation; and apply a fifth voltage, which is higher than the second voltage and the fourth voltage and which is lower than the first voltage and the third voltage, is applied to the first interconnect and the second interconnect, in the third operation.

12. The memory device of claim 11, wherein the first circuit performs the third operation following the first operation and performs the second operation following the third operation.

13. The memory device of claim 10, wherein the first voltage is lower than the third voltage.

14. The memory device of claim 10, wherein:

the variable resistance element has a first resistance due to a current flowing through the variable resistance element from the first interconnect toward the second interconnect;

the variable resistance element has a second resistance due to a current flowing through the variable resistance element from the second interconnect toward the first interconnect; and the first resistance is higher than the second resistance.

15. The memory device of claim 10, wherein the first circuit includes:

a first sub-circuit configured to apply the first voltage to the first interconnect;

a second sub-circuit configured to apply the second voltage to the second interconnect;

a third sub-circuit configured to apply the third voltage to the second interconnect; and a fourth sub-circuit configured to apply the fourth voltage to the first interconnect.

16. The memory device of claim 10, further comprising a sense amplifier circuit coupled to the first interconnect and the second interconnect, wherein the sense amplifier includes an operational amplifier which receives a voltage based on a potential of the first interconnect at a non-inverting input terminal and receives a voltage based on a potential of the second interconnect at an inverting input terminal.

17. The memory device of claim 10, wherein:

the first interconnect includes a first sub-interconnect and a second sub-interconnect;

the second interconnect includes a third sub-interconnect and a fourth sub-interconnect; and the memory device further comprises:

a first variable resistance between the first sub-interconnect and the second sub-interconnect; and a second variable resistance between the third sub-interconnect and the fourth sub-interconnect.

18. The memory device of claim 17, wherein:

the first variable resistance includes:

a plurality of first transistors coupled in series between the first sub-interconnect and the second sub-interconnect;

a first switch coupled between the first sub-interconnect and the second sub-interconnect; and a plurality of second switches each of which is coupled between the first sub-interconnect and a node to which two of the first transistors are coupled; and the second variable resistance includes:

a plurality of second transistors coupled in series between the third sub-interconnect and the fourth sub-interconnect;

a third switch coupled between the third sub-interconnect and the fourth sub-interconnect; and a plurality of fourth switches each of which is coupled between the third sub-interconnect and a node to which two of the second transistors are coupled.

* * * * *